(12) United States Patent
Sasaki et al.

(10) Patent No.: US 10,903,228 B2
(45) Date of Patent: Jan. 26, 2021

(54) SEMICONDUCTOR STORAGE DEVICE

(71) Applicant: TOSHIBA MEMORY CORPORATION, Tokyo (JP)

(72) Inventors: Hiroki Sasaki, Aichi-ken (JP); Atsushi Murakoshi, Mie-ken (JP); Ryuji Ohba, Mie-ken (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/114,074

(22) Filed: Aug. 27, 2018

(65) Prior Publication Data

US 2019/0273092 A1  Sep. 5, 2019

(30) Foreign Application Priority Data

Mar. 1, 2018  (JP) .................................. 2018-036309

(51) Int. Cl.
| | |
|---|---|
| *H01L 27/11582* | (2017.01) |
| *H01L 27/1157* | (2017.01) |
| *H01L 23/532* | (2006.01) |
| *G11C 7/06* | (2006.01) |
| *H01L 21/768* | (2006.01) |
| *G11C 8/14* | (2006.01) |
| *H01L 29/792* | (2006.01) |
| *G11C 8/10* | (2006.01) |
| *G11C 7/18* | (2006.01) |
| *H01L 29/788* | (2006.01) |
| *H01L 27/11556* | (2017.01) |

(52) U.S. Cl.
CPC ......... *H01L 27/11582* (2013.01); *G11C 7/06* (2013.01); *G11C 7/18* (2013.01); *G11C 8/10* (2013.01); *G11C 8/14* (2013.01); *H01L 21/76897* (2013.01); *H01L 23/5329* (2013.01); *H01L 27/1157* (2013.01); *H01L 29/7926* (2013.01); *H01L 27/11556* (2013.01); *H01L 29/7889* (2013.01)

(58) Field of Classification Search
None
See application file for complete search history.

(56) References Cited

U.S. PATENT DOCUMENTS

| | | |
|---|---|---|
| 8,653,577 B2 | 2/2014 | Fukuzumi et al. |
| 2015/0171098 A1 | 6/2015 | Simsek-Ege et al. |

(Continued)

*Primary Examiner* — Jack S Chen
(74) *Attorney, Agent, or Firm* — Foley & Lardner LLP

(57) ABSTRACT

A semiconductor storage device includes a semiconductor substrate and a plurality of first wiring layers stacked above the semiconductor substrate in a first direction orthogonal to the semiconductor substrate, and extending in a second direction intersecting the first direction and parallel to the semiconductor substrate. The device further includes a first memory pillar including a semiconductor layer and a first insulation layer extending in the first direction, the first insulation layer provided between the plurality of first wiring layers and the semiconductor layer so as to contact the semiconductor layer, and charge storage layers provided respectively between the plurality of first wiring layers and the first insulation layer. One or more of the charge storage layers is in contact with the first insulation layer. A plurality of second insulation layers is provided between each of the plurality of first wiring layers and each of the charge storage layers.

15 Claims, 27 Drawing Sheets

(56) References Cited

U.S. PATENT DOCUMENTS

| | | |
|---|---|---|
| 2016/0133752 A1 | 5/2016 | Hopkins et al. |
| 2016/0148949 A1 | 5/2016 | Jayanti et al. |
| 2017/0263613 A1 | 9/2017 | Murakoshi et al. |
| 2017/0263780 A1* | 9/2017 | Sawa ................ H01L 27/11556 |

* cited by examiner

SEMICONDUCTOR STORAGE DEVICE

CROSS-REFERENCE TO RELATED APPLICATION

This application is based upon and claims the benefit of priority from Japanese Patent Application No. 2018-036309, filed Mar. 1, 2018, the entire contents of which are incorporated herein by reference.

FIELD

Embodiments described herein relate generally to a semiconductor storage device.

BACKGROUND

As a semiconductor storage device, a NAND-type flash memory is known.

DETAILED DESCRIPTION

Figure 1:
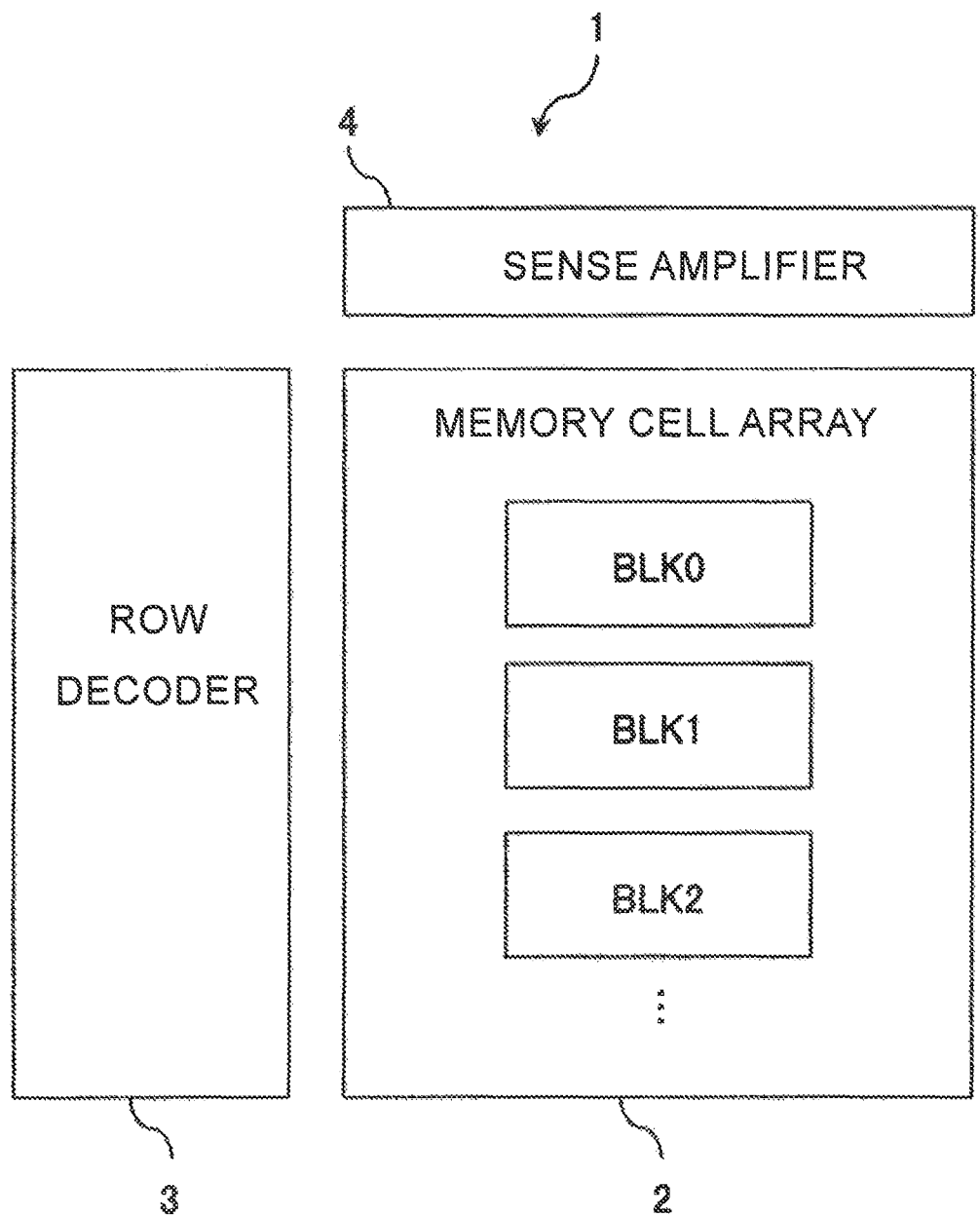
FIG. 1 is a block diagram of a semiconductor storage device according to a first embodiment.

According to some embodiments, a semiconductor storage device capable of reducing a chip area is provided.

In general, according to at least one embodiment, a semiconductor storage device includes a semiconductor substrate; a plurality of first wiring layers stacked above the semiconductor substrate in a first direction, which is perpendicular to the semiconductor substrate, and extending in a second direction, which intersects the first direction and is parallel to the semiconductor substrate; a first memory pillar including a semiconductor layer extending in the first direction, a first insulation layer extending in the first direction and provided between the plurality of first wiring layers and the semiconductor layer so as to be in contact with the semiconductor layer, and a plurality of charge storage layers respectively provided between the plurality of first wiring layers and the first insulation layer such that each of the plurality of charge storage layers is in contact with the first insulation layer; and a plurality of second insulation layers provided between each of the plurality of first wiring layers and each of the plurality of charge storage layers.

Hereinafter, embodiments will be described with reference to the accompanying drawings. In addition, in the following description, constituent elements having substantially the same function and configuration are denoted by the same reference numerals, and redundant descriptions are given only when necessary. In addition, each of the embodiments described below exemplifies an apparatus or a method of implementing technical aspects of one or more embodiments, and the technical aspects of the embodiments are not limited with respect to, for example, the material, shape, structure and arrangement of constituent elements to the following ones. The technical aspects of the embodiments may be modified in various ways within the scope of the claims.

1. First Embodiment

A semiconductor storage device according to a first embodiment will be described. Hereinafter, as a semiconductor storage device, a three-dimensionally stacked NAND-type flash memory in which memory cell transistors are three-dimensionally stacked above a semiconductor substrate will be described by way of example.

1.1 Configuration

1.1.1 Overall Configuration of Semiconductor Storage Device

First, an overall configuration of a semiconductor storage device will be described with reference to FIG. 1. FIG. 1 is an example of a block diagram illustrating a basic overall configuration of a semiconductor storage device.

As illustrated in FIG. 1, the semiconductor storage device 1 includes a memory cell array 2, a row decoder 3, and a sense amplifier 4.

The memory cell array 2 includes a plurality of blocks BLK. In the example of FIG. 1, only three blocks BLK0 to BLK2 are illustrated, but the number thereof is not limited. Each block BLK may include a plurality of three-dimensionally stacked memory cell transistors, which are associated with rows and columns.

The row decoder 3 decodes a row address received from the outside. Then, the row decoder 3 selects the row direction of the memory cell array 2 based on the decoding result. More specifically, the row decoder applies a voltage to various wirings in order to select the row direction.

The sense amplifier 4 senses the data read from one of the blocks BLK at the time of reading data. In addition, at the time of writing data, the sense amplifier applies a voltage depending on the written data to the memory cell array 2.

1.1.2 Circuit Configuration of Memory Cell Array

Figure 2:
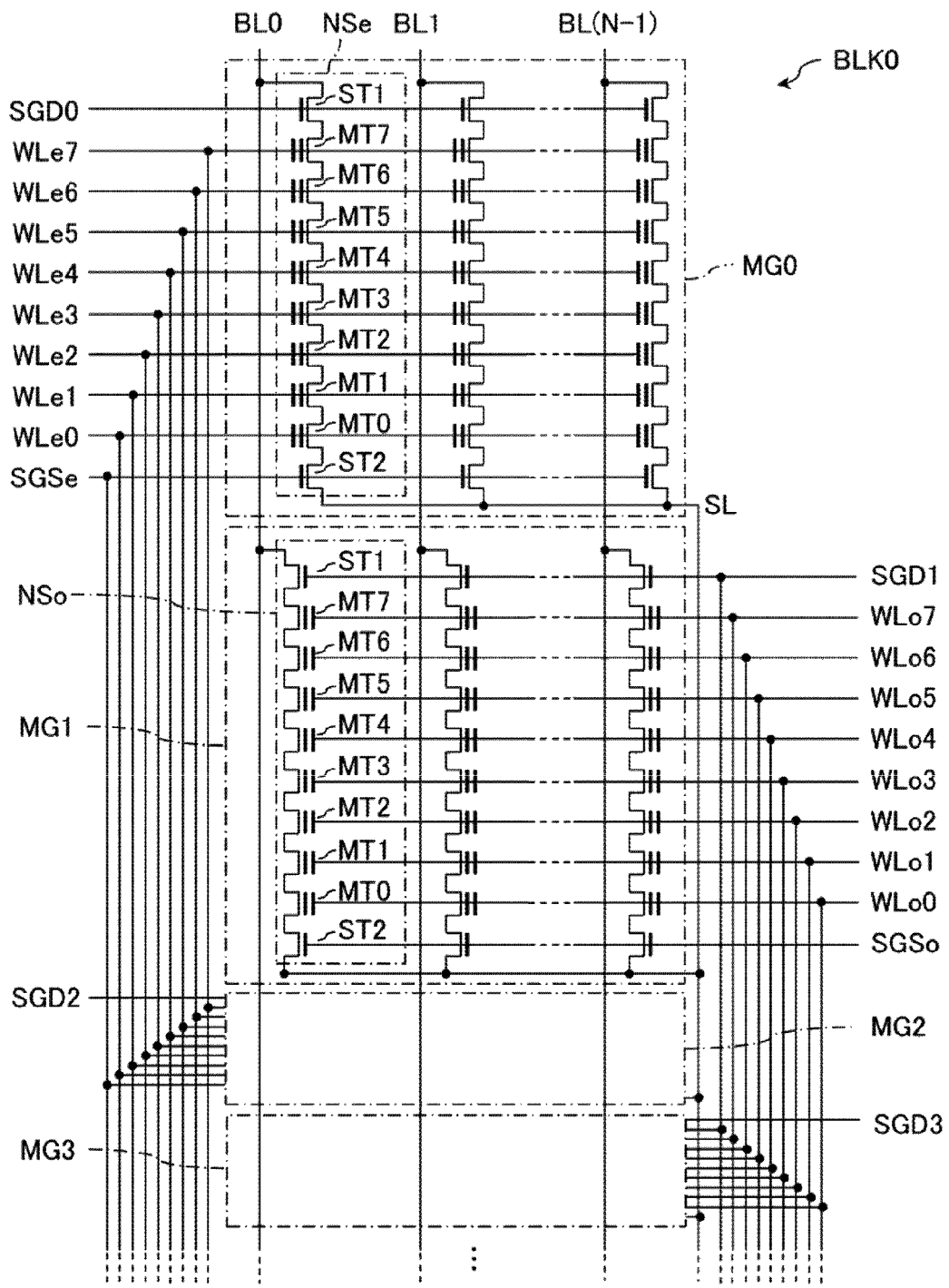
FIG. 2 is a circuit diagram of a memory cell array in the semiconductor storage device according to the first embodiment.

Next, a circuit configuration of the memory cell array 2 will be described with reference to FIG. 2. FIG. 2 illustrates a circuit diagram of the memory cell array 2 in one block BLK.

As illustrated in FIG. 2, the block BLK includes a plurality of memory groups MG (MG0, MG1, MG2, MG3, . . . ). In addition, each memory group MG includes a plurality of NAND strings NS. Hereinafter, the NAND strings of the even-numbered memory group MGe (MG0, MG2, . . . ) will be referred to as NAND strings NSe, and the NAND strings of the odd-numbered memory group MGo (MG1, MG3, . . . ) will be referred to as NAND strings NSo.

Each of the NAND strings NS includes, for example, eight memory cell transistors MT (MT0 to MT7) and select transistors ST1 and ST2. Each memory cell transistor MT includes a control gate and a charge storage layer, and holds data in a nonvolatile state.

In addition, the memory cell transistor MT may be a MONOS type using an insulation film for the charge storage layer, or may be an FG type using a conductive layer for the charge storage layer. Hereinafter, in the present embodiment, the FG type will be described by way of example. In addition, the number of memory cell transistors MT is not limited to eight, and may be, for example, 16, 32, 64, or 128, and the number thereof is not limited. In addition, the number of select transistors ST1 and ST2 is freely set, and there may be one or more such transistors.

The memory cell transistor MT is connected in series between a source of the select transistor ST1 and a drain of the select transistor ST2. More specifically, the current paths of the memory cell transistors MT0 to MT7 are connected in series. Then, a drain of the memory cell transistor MT7 is connected to the source of the select transistor ST1, and a source of the memory cell transistor MT0 is connected to the drain of the select transistor ST2.

A gate of the select transistor ST1 in each of the memory groups MG is connected to a corresponding one of select gate lines SGD (SGD0, SGD1, . . . ). Each select gate line SGD is independently controlled by the row decoder 3. In addition, a gate of the select transistor ST2 in each of the even-numbered memory groups MGe (MG0, MG2, . . . ) is connected in common to a select gate line SGSe, for example, and a gate of the select transistor ST2 in each of the odd-numbered memory groups MGo (MG1, MG3, . . . ) is connected in common to a select gate line SGSo, for example. For example, the select gate lines SGSe and SGSo may be connected in common, or may be independently controlled.

Control gates of the memory cell transistors MT0 to MT7 in the memory groups MGe in the same block BLK are connected in common to word lines WLe0 to WLe7, respectively. In addition, control gates of the memory cell transistors MT0 to MT7 in the memory groups MGo in the same block BLK are connected in common to word lines WLo0 to WLo7, respectively. The word lines WLe and WLo are independently controlled by the row decoder 3.

The block BLK may be, for example, an erase unit of data, and the data held in the memory cell transistors MT in the same block BLK are erased collectively.

In the memory cell array 2, a drain of the select transistor ST1 in each of the NAND strings NS in the same column is connected in common to a bit line BL (BL0 to BL (N−1), where (N−1) is an integer of 2 or more). That is, the bit line BL connects the NAND strings NS in common between the plurality of memory groups MG. In addition, sources of a plurality of select transistors ST2 are connected in common to a source line SL.

That is, each memory group MG includes a plurality of NAND strings NS, which are connected respectively to different bit lines BL and are also connected to the same select gate line SGD. In addition, the block BLK includes a plurality of memory groups MG, which share the word lines WL. Then, the memory cell array 2 includes a plurality of blocks BLK, which share the bit lines BL. Then, in the memory cell array 2, the select gate lines SGS, the word lines WL, and the select gate lines SGD are stacked above a semiconductor substrate, whereby the memory cell transistors MT are three-dimensionally stacked.

1.1.3 Overall Configuration of Memory Cell Array

Figure 3:
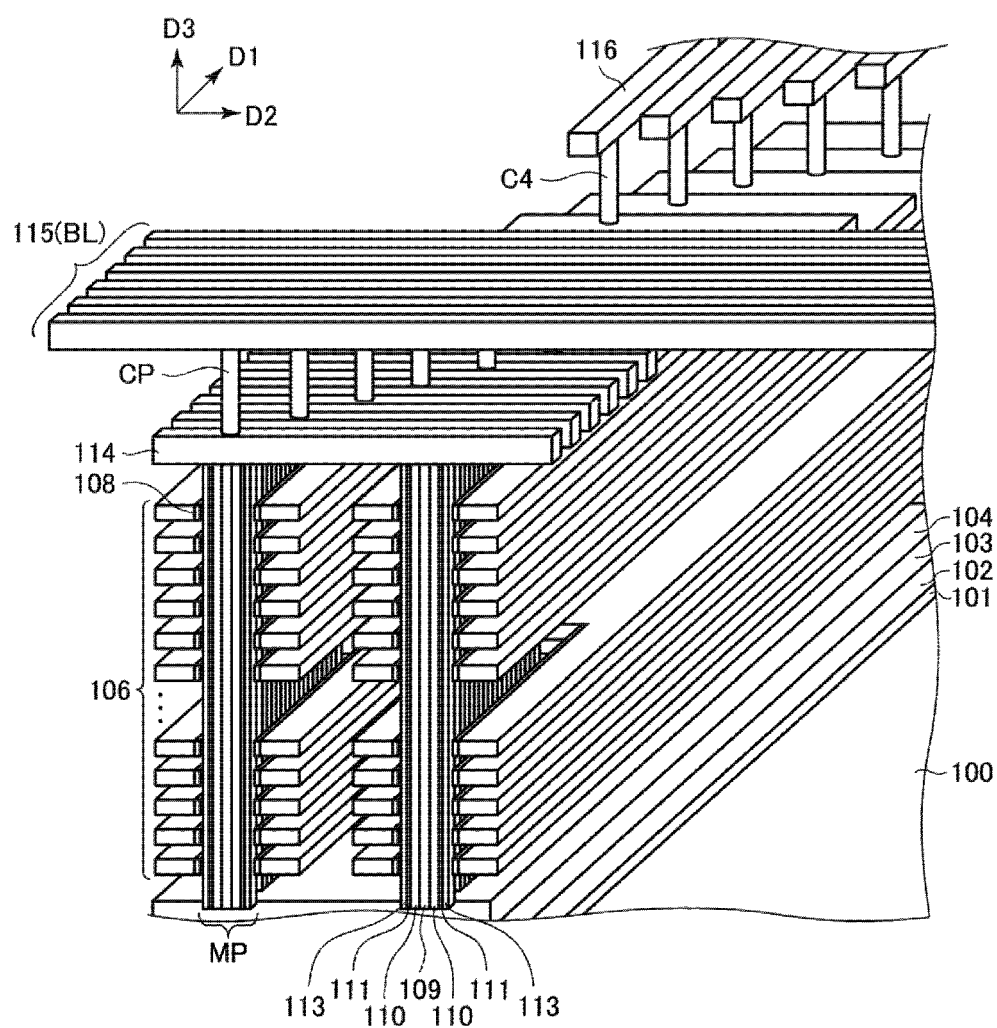
FIG. 3 is a perspective view of a memory cell array in the semiconductor storage device according to the first embodiment.

Next, an overall configuration of the memory cell array 2 will be described with reference to FIG. 3. FIG. 3 is a perspective view corresponding to one block BLK of the memory cell array 2. In the example of FIG. 3, an interlayer insulation film is omitted.

As illustrated in FIG. 3, an insulation layer 101 is formed above the semiconductor substrate 100. A conductive layer 102, a wiring layer 103, and a conductive layer 104, which extend in a first direction D1 parallel to the semiconductor substrate 100, are sequentially stacked on the insulation layer 101. The conductive layer 102, the wiring layer 103, and the conductive layer 104 function as the source line SL. A memory pillar MP, which functions as the NAND string NS, is formed on the conductive layer 104 along a third direction D3 perpendicular to the semiconductor substrate 100. A plurality of memory pillars MP are arranged in a matrix shape along the first direction D1 and a second direction D2 perpendicular to the first direction D1, and the plurality of memory pillars MP are connected to one conductive layer 104. Each memory pillar MP includes a charge storage layer 113, an insulation layer 111, a semiconductor layer 110, and a core layer 109. A structure of the memory pillar MP will be described later in detail.

In addition, a plurality of wiring layers 106, which function as the word lines WL and the select gate lines SGS and SGD, are stacked above the conductive layer 104 with an interlayer insulation film (not illustrated) interposed therebetween. Each memory pillar MP is disposed between two wiring layers 106, which are arranged along the second direction D2. That is, a set of two wiring layers 106 and the memory pillar MP sandwiched therebetween is repeatedly arranged along the second direction D2. More specifically, in the example of FIG. 3, the wiring layer 106, the memory pillar MP, the wiring layer 106, the wiring layer 106, the memory pillar MP, and the wiring layer 106 are sequentially arranged along the second direction D2. Then, an insulation layer 108 is formed between the wiring layer 106 and the memory pillar MP.

The stacked wiring layers 106 extend along the first direction D1, and end portions thereof are pulled out stepwise (hereinafter referred to as "terraces"). Contact plugs C4 are formed respectively on these terraces so as to be electrically connected to a plurality of wiring layers 116, which extend along the first direction D1.

A wiring layer 114 is formed on the upper surfaces of two memory pillars MP, which are arranged along the second direction D2, so as to extend in the second direction D2. That is, the two memory pillars MP are electrically connected to each other via the wiring layer 114. For example, the wiring layer 114 interconnects the NAND strings NS in common between the plurality of memory groups MG of one block BLK. The plurality of memory pillars MP, which are arranged along the first direction D1, are connected to different wiring layers 114, respectively. A wiring layer 115 is formed above each wiring layer 114 so as to extend in the second direction D2. The wiring layer 115 functions as the bit line BL. A contact plug CP is formed on the wiring layer 114. The wiring layer 114 is electrically connected to the wiring layer 115 via the contact plug CP.

In addition, in the present embodiment, two memory pillars MP, which are adjacent to each other in the second direction D2, are electrically connected to the wiring layer 115 via the wiring layer 114, but each memory pillar MP may be electrically connected to the wiring layer 114.

1.1.4 Planar Configuration of Memory Cell Array

Figure 4:
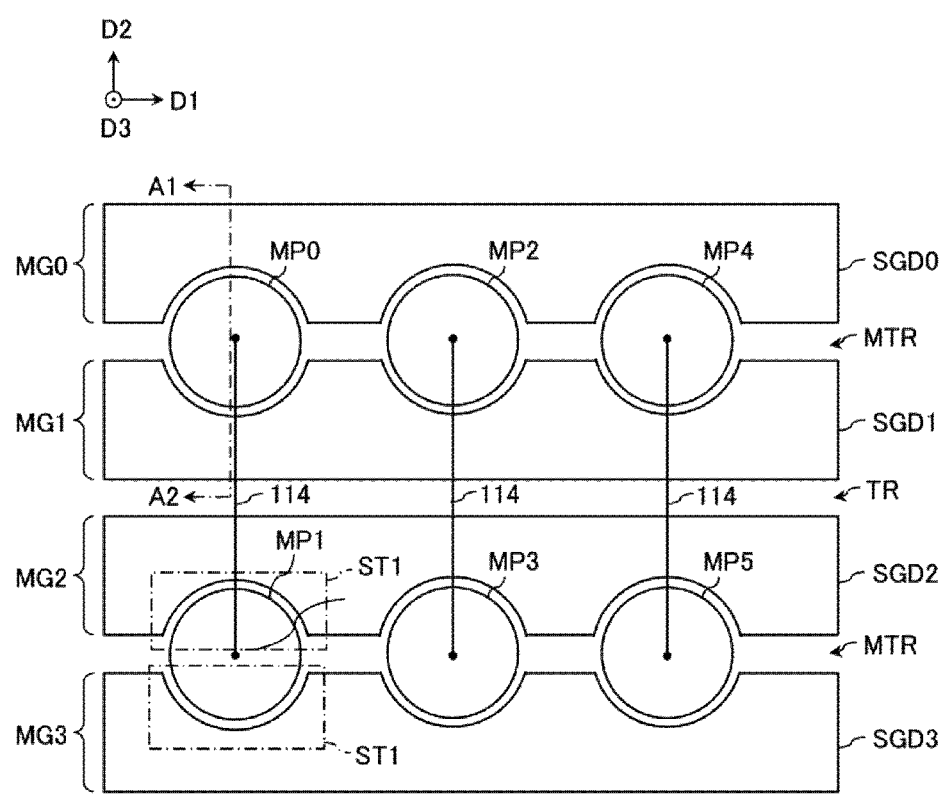
FIG. 4 is a plan view of the memory cell array in the semiconductor storage device according to the first embodiment.

Next, a planar configuration of the memory cell array 2 will be described with reference to FIG. 4. FIG. 4 illustrates the planar layout of the select gate line SGD in a plane parallel to the semiconductor substrate of a certain block BLK. In this example, a case where one block BLK includes four memory groups MG, that is, four select gate lines SGD will be described. In the example of FIG. 4, an interlayer insulation film is omitted.

As illustrated in FIG. 4, select gate lines SGD0 to SGD3 are arranged along the second direction D2 so as to extend in the first direction D1. A contact plug C4 (not illustrated) is formed on one end of each of the select gate lines SGD0 to SGD3.

The select gate lines SGD0 and SDG1 are separated from each other by an interlayer insulation film (not illustrated). Then, a plurality of memory pillars MP (MP0, MP2, MP4, . . . ) are provided along the first direction D1 between the select gate lines SGD0 and SDG1 so as to extend in the third direction D3. Similarly, a plurality of memory pillars MP (MP1, MP3, MP5, . . . ) are provided along the first direction D1 between the select gate lines SGD2 and SDG3. For example, an area, which includes a portion of the memory pillar MP1 and the select gate line SGD2, functions as the select transistor ST1 in the memory group MG2, and an area, which includes a portion of the memory pillar MP1 and the select gate line SGD3, functions as the select transistor ST1 in the memory group MG3. A relationship between the other memory pillars MP and the select gate lines SGD is also the same.

In addition, the select gate lines SGD1 and SDG2 are separated by an interlayer insulation film (not illustrated), but no memory pillar MP is provided between the select gate lines SGD1 and SDG2. Hereinafter, when the memory pillar MP is provided between two select gate lines SGD, a groove area between the two select gate lines SGD is referred to as a "memory trench MTR", and when the memory pillar MP is not provided between the two select gate lines SGD, the groove area is simply referred to as a "trench TR". In addition, the memory pillar MP may be provided between the select gate lines SGD1 and SDG2.

The memory pillars MP0 and MP1, which are arranged along the second direction D2, are connected to one wiring layer 114, and are connected to the wiring layer 115, which functions as the bit line BL0 via the wiring layer 114. Similarly, the memory pillars MP2 and MP3 are connected to one wiring layer 114, and are connected to the wiring layer 115, which functions as the bit line BL1 via the wiring layer 114. The memory pillars MP4 and MP5 are connected to one wiring layer 114, and are connected to the wiring layer 115, which function as the bit line BL2 via the wiring layer 114. A relationship between the other memory pillars MP and the bit lines BL may also be the same.

1.1.5 Cross-sectional Configuration of Memory Cell Array

Figure 5:
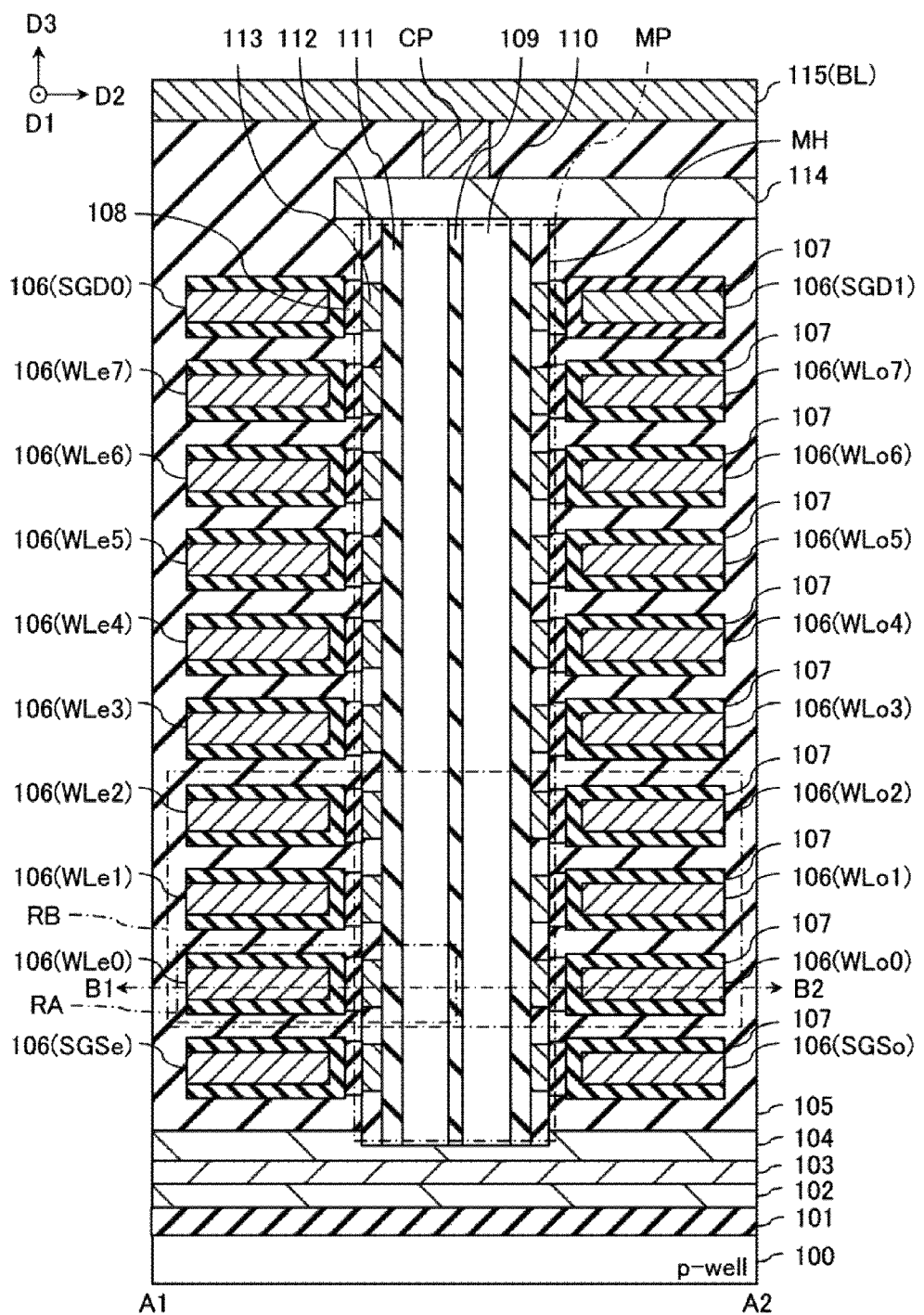
FIG. 5 is a cross-sectional view of the memory cell array taken along line A1-A2 in FIG. 4.

Next, a cross-sectional configuration of the memory cell array 2 will be described with reference to FIG. 5. FIG. 5 is a cross-sectional view of the memory cell array 2 taken along line A1-A2 in FIG. 4.

As illustrated in FIG. 5, the insulation layer 101 is formed above the semiconductor substrate 100. The conductive layer 102, the wiring layer 103, and the conductive layer 104, which function as the source line, are stacked on the insulation layer 101. For example, a circuit such as, for example, the sense amplifier 4 may be provided in an area of the insulation layer 101, that is, between the semiconductor substrate 100 and the conductive layer 102.

For example, silicon oxide (SiO2) may be used for the insulation layer 101. By further way of example, polycrystalline silicon may be used for the conductive layers 102 and 104. The wiring layer 103 is formed of a conductive material, and for example, tungsten (W) may be used.

The wiring layers 106, which functions as the select gate line SGSe, the word lines WLe0 to WLe7, and the select gate line SGD0, are sequentially stacked with a distance therebetween above the conductive layer 104 with an interlayer insulation film 105 interposed therebetween. Similarly, the wiring layers 106, which function as the select gate line SGSo, the word lines WLo0 to WLo7, and the select gate line SGD1, are sequentially stacked with a distance therebetween with the interlayer insulation film 105 interposed therebetween. The wiring layers 106 extend in the first direction D1, respectively. For example, SiO2 may be used for the interlayer insulation film 105. The wiring layers 106 are formed of a conductive material, and for example, tungsten (W) may be used. Hereinafter, a case where W is used for the wiring layers 106 and a stacked film of titanium nitride (TiN) and aluminum oxide (AlOX) is used as a barrier layer (not illustrated) of W will be described.

An insulation layer 107 is formed so as to cover the upper surface, the bottom surface, and a portion of the side surface of each wiring layer 106 (and the barrier layer). For example, SiO2 may be used for the insulation layer 107.

A plurality of insulation layers 108 are provided so as to be in contact with the side surface of the insulation layer 107 and the side surface of the memory pillar MP (charge storage layer 113) so as to correspond to the respective wiring layers 106. For example, silicon oxynitride (SiON) may be used for the insulation layers 108. The insulation layer 107 and the insulation layer 108, which are provided between the wiring layer 106 and the charge storage layer 113, function as a block insulation film of the memory cell transistor MT and the select transistors ST1 and ST2.

A memory hole MH is formed in the second direction D2 between the wiring layers 106, which function as the select gate line SGSe, the word lines WLe0 to WLe7, and the select gate line SGD0, and the wiring layers 106, which function as the select gate line SGSo, the word lines WLo0 to WLo7, and the select gate line SGD1. A portion of the side surface of the memory hole MH is in contact with the insulation layer 108, and the bottom surface of the memory hole reaches the conductive layer 104. On the side surface of the memory hole MH, the charge storage layer 113 is formed in each of areas in contact with the plurality of insulation layers 108, and an insulation layer 112 is formed in the remaining area. For example, SiO2 is used for the insulation layer 112. The charge storage layer 113 functions as a charge storage layer of the memory cell transistor MT and the select transistors ST1 and ST2. For example, polycrystalline silicon may be used for the charge storage layer 113. Hereinafter, a case where the charge storage layer 113 is polycrystalline silicon will be described.

In addition, the film thickness of the polycrystalline silicon in the second direction D2 may range from 2 nm to 4 nm. When the film thickness of polycrystalline silicon is less than 2 nm, polycrystalline silicon has difficulty in forming a film. In addition, when the film thickness of polycrystalline silicon is larger than 4 nm, polycrystalline silicon is insufficient to form the insulation layer 112 to be described later, and it is difficult to separate a plurality of charge storage layers 113 so as to correspond to the respective wiring layers 106. In addition, when the film thickness of polycrystalline silicon is increased, the diameter of the memory pillar MP is increased and the chip area is increased.

In addition, for example, tantalum nitride (TaN), TiN, titanium silicide (TiSi2), tantalum silicide (TaSi2), tantalum silicon nitride (TaSiN), tungsten silicide (WSi2), or ruthenium silicide (RuSi2) may be used for the charge storage layer 113.

The insulation layer 111 is formed on the inner side surfaces of the insulation layer 112 and the charge storage layer 113 in the memory hole MH. The inside of the memory hole MH is filled with the semiconductor layer 110, the bottom surface of which is in contact with the semiconductor substrate 100, and a core layer 109 is formed in the center of the memory hole MH so as to extend in the third direction D3. The insulation layer 111 functions as a tunnel insulation film of the memory cell transistor MT and the select transistors ST1 and ST2. For example, SiO2 is used for the insulation layer 111. The semiconductor layer 110 is an area in which a channel of the memory cell transistor MT and the select transistors ST1 and ST2 is formed. For example, polycrystalline silicon may be used for the semiconductor layer 110, and SiO2 may be used for the core layer 109.

The wiring layer 114, which extends in the second direction D2, is provided on the memory pillar MP so as to be in contact with the semiconductor layer 110. The wiring layer 114 is formed of a conductive material, and for example, polycrystalline silicon doped with, for example, phosphorus (P), or a metal material such as, for example, W is used. Then, the contact plug CP is provided on the wiring layer 114. The contact plug CP is formed of a conductive material, and for example, polycrystalline silicon doped with, for example, phosphorus (P), or a metal material such as, for example, W is used.

The wiring layer 115, which extends in the second direction D2, is formed on the contact plug CP. The wiring layer 115 functions as the bit line BL. The wiring layer 115 is formed of a conductive material, and for example, a metal material such as, for example, W is used.

1.1.6 Planar Configuration of Memory Cell Transistor

Figure 6:
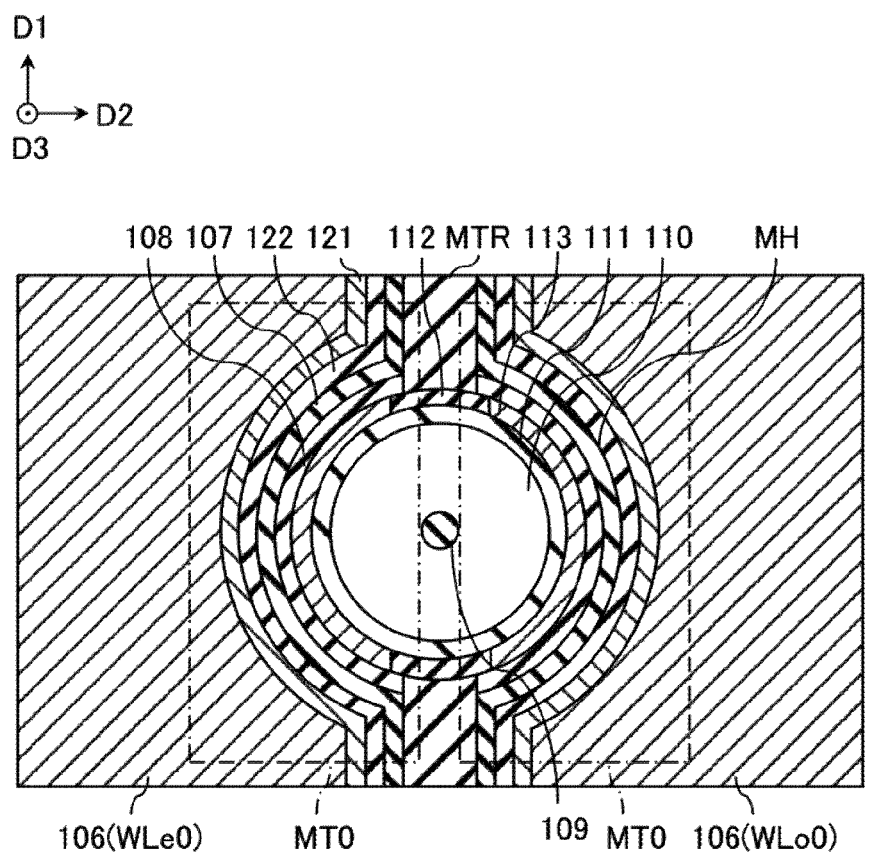
FIG. 6 is a cross-sectional view of a memory cell transistor taken along line B1-B2 in FIG. 5.

Next, a planar configuration of the memory cell transistor MT will be described in detail with reference to FIG. 6. FIG. 6 is a cross-sectional view of the wiring layers 106, which function as the word lines WLe0 and WLo0, and the memory pillar MP taken along line B1-B2 parallel to the semiconductor substrate in FIG. 5.

As illustrated in FIG. 6, the memory trench MTR is provided between the wiring layer 106, which functions as the word line WLe0, and the wiring layer 106, which functions as the word line WLo0. In addition, the memory pillar MP is formed between the two wiring layers 106.

In the memory pillar MP, the semiconductor layer 110 is provided so as to surround the core layer 109, and the insulation layer 111 is further provided so as to surround the semiconductor layer 110. In addition, the insulation layer 112 and the charge storage layer 113, which are in contact with side surface of the memory pillar MP, are provided so as to surround the insulation layer 111. More specifically, the insulation layer 112 is provided on the side surface of the memory pillar MP so as to be in contact with the memory trench MTR and an end area of the insulation layer 108, and the charge storage layer 113 is provided on the side surface of the memory pillar MP, which is in contact with an region excluding the end area of the insulation layer 108.

The insulation layer 107 is provided so as to surround the insulation layer 108 and to be in contact with the side surface of the memory trench MTR. In addition, a second barrier layer 122 is provided so as to surround the insulation layer 107, and a first barrier layer 121 is provided so as to surround the second barrier layer 122. Then, the wiring layer 106 is provided so as to be in contact with the first barrier layer 121. In addition, each of the first barrier layer 121, the second barrier layer 122, and the insulation layer 107 is provided so as to be in contact with the side surface of the wiring layer 106 in the first direction D1 (not illustrated).

The first barrier layer 121 functions as a barrier layer when forming the wiring layer 106 (e.g., W). For example, TiN is used for the first barrier layer 121. In this case, TiN forms a film by LPCVD using, for example, titanium tetrachloride (TiCl4). The second barrier layer 122 functions as a barrier layer when forming the first barrier layer 121. For example, when forming the first barrier layer 121, that is, a film of TiN by LPCVD using TiCl4, for example, AlOx is used for the second barrier layer 122. In addition, for example, when TiN is formed by CVD using an organic source, the second barrier layer 122 may be discarded. Materials of the first barrier layer 121 and the second barrier layer 122 are appropriately selected depending on a conductive material used for the wiring layer 106.

An area, which includes the wiring layer 106 functioning as the word line WLe0 and a portion of the memory pillar MP, functions as the memory cell transistor MT0 of the memory group MG0, and an area, which includes the wiring layer 106 functioning as the word line WLo0 and a portion of the memory pillar MP, functions as the memory cell transistor MT0 of the memory group MG1.

1.1.7 Cross-sectional Configuration of Memory Cell Transistor

Figure 7:
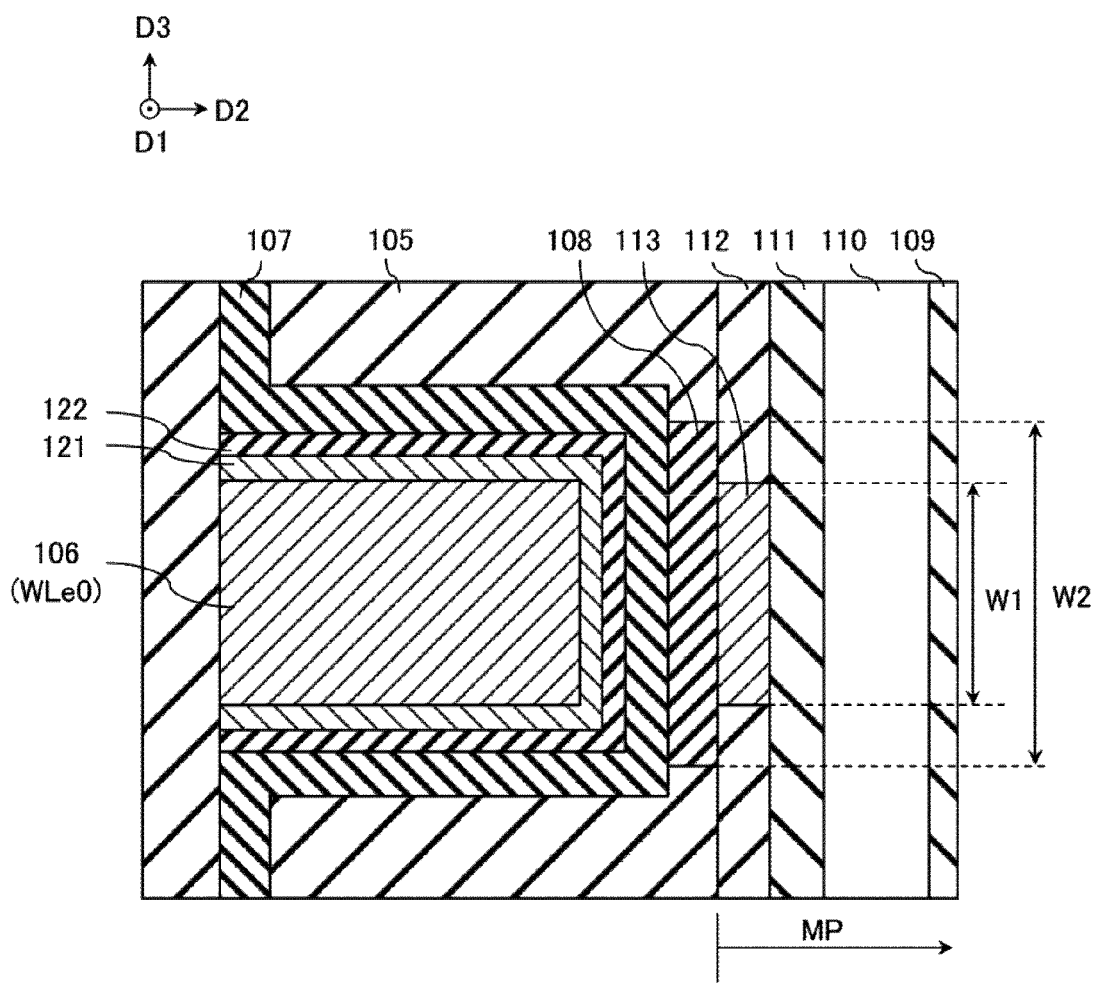
FIG. 7 is an enlarged view of area RA in FIG. 5.

Next, a cross-sectional configuration of the memory cell transistor MT will be described in detail with reference to FIG. 7. FIG. 7 is an enlarged view of area RA in FIG. 5. That is, FIG. 7 illustrates a cross section of the wiring layer 106 functioning as the word line WLe0 and a portion of the memory pillar MP.

As illustrated in FIG. 7, the upper surface and the bottom surface of the wiring layer 106 and the side surface of the wiring layer 106 in the direction toward the memory pillar MP are covered with the first barrier layer 121. Similarly, the upper surface and the bottom surface of the first barrier layer 121 and the side surface of the first barrier layer 121 in the direction toward the memory pillar MP are covered with the second barrier layer 122, and the upper surface and the bottom surface of the second barrier layer 122 and the side surface of the second barrier layer 122 in the direction toward the memory pillar MP are covered with the insulation layer 107.

One side surface of the insulation layer 108 is in contact with the insulation layer 107, and an opposite side surface of the insulation layer 108 is in contact with the memory pillar MP. More specifically, the insulation layer 108 is in contact with the insulation layer 112 at the vicinity of the upper end and the lower end thereof in the third direction D3, and the central portion of the insulation layer 108 is in contact with the charge storage layer 113. Accordingly, assuming that the length of the charge storage layer 113 is W1 and the length of the insulation layer 108 is W2 in the third direction D3, there is a relationship of W1<W2. That is, the insulation layer 108 is longer than the charge storage layer 113 in the third direction D3.

1.2 Method of Manufacturing Memory Cell Array

Next, a method of manufacturing the memory cell array 2 will be described with reference to FIGS. 8 to 15. FIGS. 8 to 15 illustrate enlarged views of area RB in FIG. 5. That is, FIGS. 8 to 15 illustrate cross-sectional views taken along the third direction D3 of the wiring layers 106, which function as the word lines WLe0 to WLe2 and WLo0 to WLo2, and a portion of the memory pillar MP.

Figure 8:
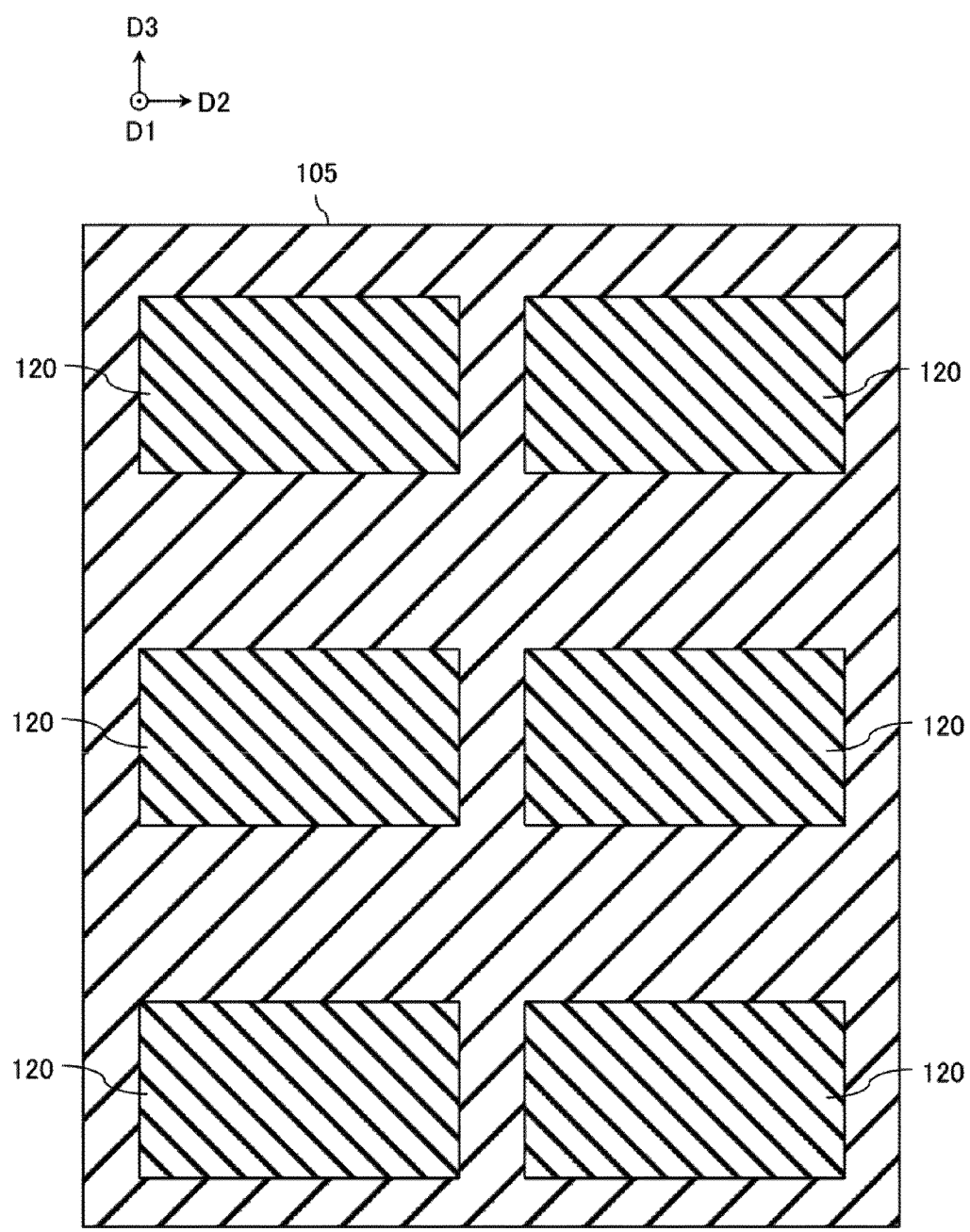
FIG. 8 is a view illustrating a process of manufacturing the memory cell array in the semiconductor storage device according to the first embodiment.

First, as illustrated in FIG. 8, the insulation layers 120, which correspond to the wiring layers 106, are sequentially stacked with a distance therebetween on the semiconductor substrate 100 with the interlayer insulation film 105 interposed therebetween. The insulation layers 120 are sacrificial layers which are removed later, and are backfilled by the wiring layers 106. For example, silicon nitride (SiN) is used for the insulation layers 120. Hereinafter, a case where the insulation layers 120 are SiN will be described.

Figure 9:
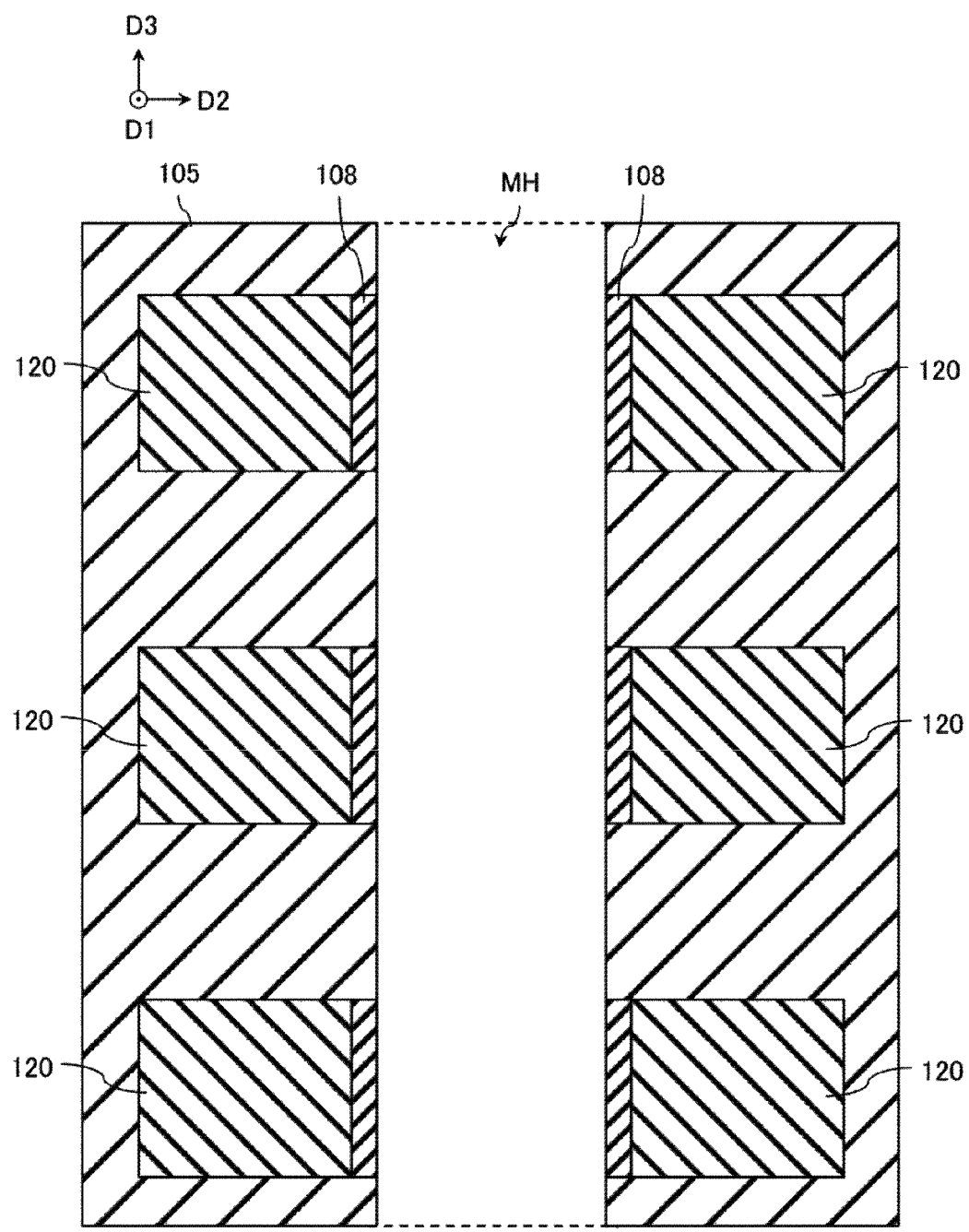
FIG. 9 is a view illustrating a process of manufacturing the memory cell array in the semiconductor storage device according to the first embodiment.

As illustrated in FIG. 9, after opening the memory hole MH, the exposed side surfaces of the insulation layers 120, on the side surface of the memory hole MH, are oxidized to form the insulation layers 108 (e.g., SiON). In a case of oxidizing the insulation layers 120, for example, an oxidation method using oxygen radicals (hereinafter referred to as radical oxidation) is used. For example, in-situ steam generation (ISSG) oxidation using hydrogen (H2) and oxygen (O2) may be used as a radical oxidation method.

Figure 10:
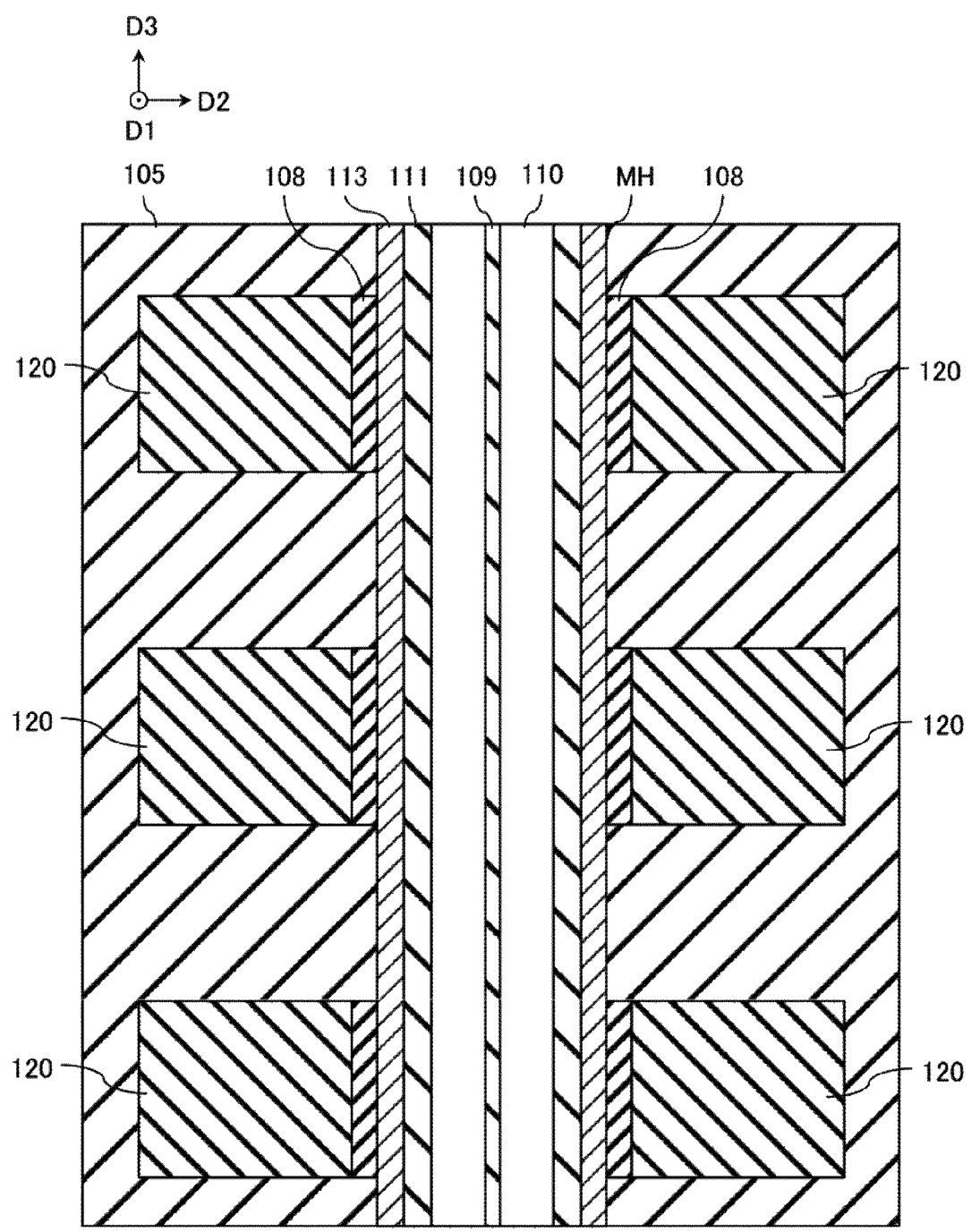
FIG. 10 is a view illustrating a process of manufacturing the memory cell array in the semiconductor storage device according to the first embodiment.

As illustrated in FIG. 10, after forming the charge storage layer 113 and the insulation layer 111 on the side surface of the memory hole MH, the semiconductor layer 110 and the core layer 109 are formed to fill the inside of the memory hole MH. More specifically, first, the charge storage layer 113 (polycrystalline silicon) is formed, and the charge storage layer 113 on the interlayer insulation film 105 and the bottom surface of the memory hole MH is removed by dry etching. Similarly, the insulation layer 111 is formed, and the insulation layer 111 on the interlayer insulation film 105 and the bottom surface of the memory hole MH is removed by dry etching. Thereby, the charge storage layer 113 and the insulation layer 111 are stacked on the side surface of the memory hole MH. Subsequently, after forming the semiconductor layer 110 and the core layer 109 to fill the memory hole MH, a surplus of the semiconductor layer 110 and the core layer 109 on the interlayer insulation film 105 is removed.

Figure 11:
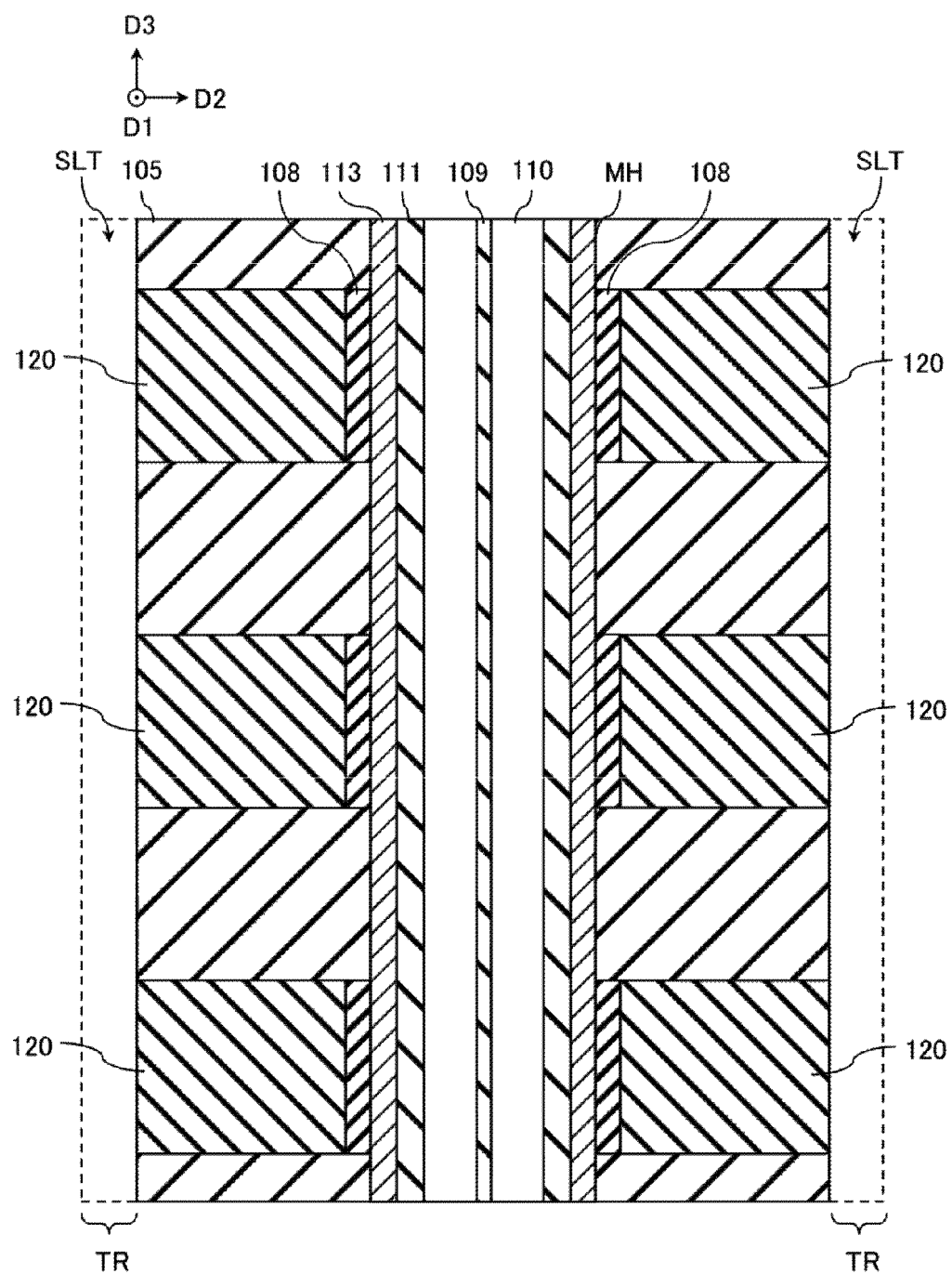
FIG. 11 is a view illustrating a process of manufacturing the memory cell array in the semiconductor storage device according to the first embodiment.

As illustrated in FIG. 11, a portion of the interlayer insulation film 105 corresponding to the trench TR is etched to form a slit SLT.

Figure 12:
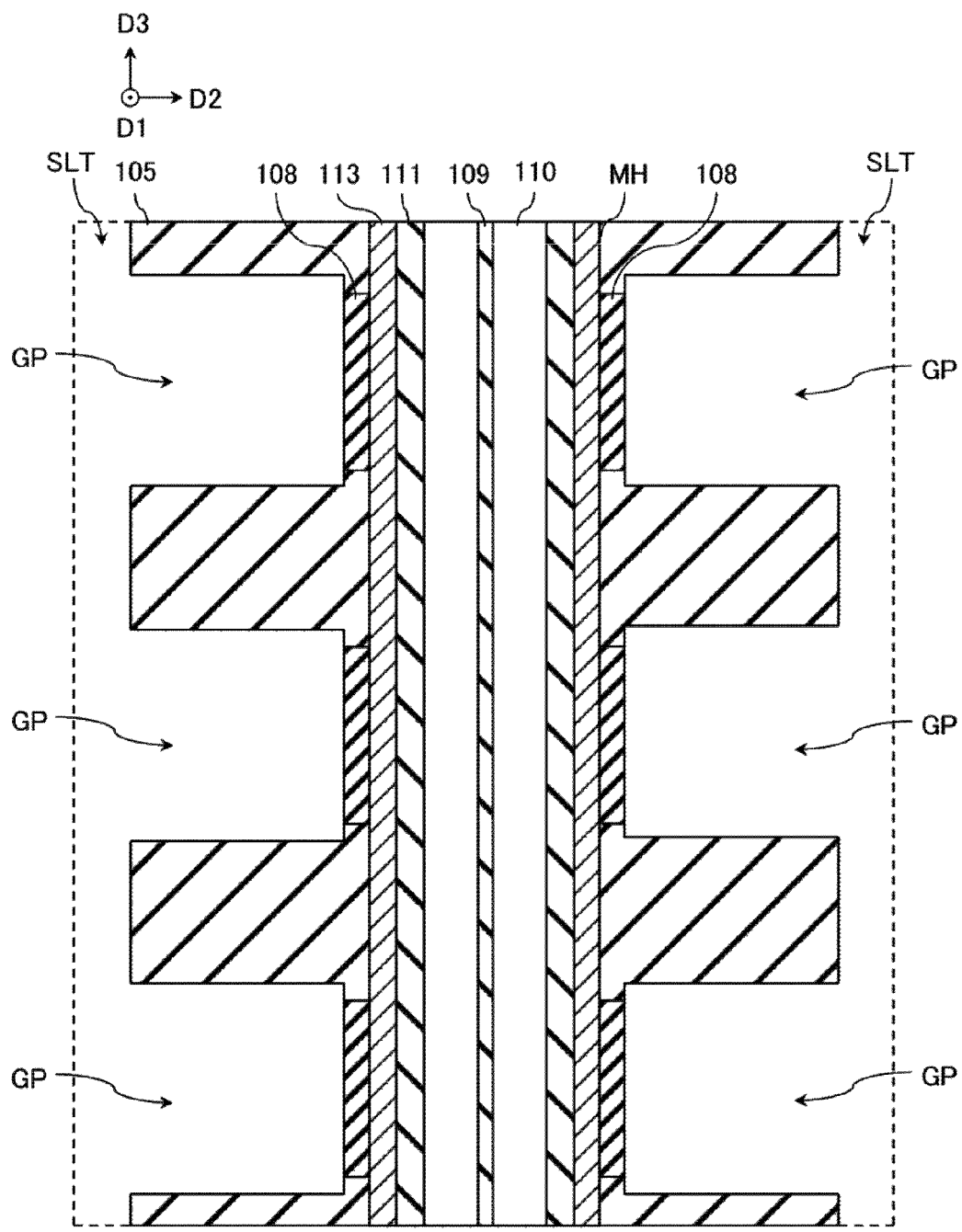
FIG. 12 is a view illustrating a process of manufacturing the memory cell array in the semiconductor storage device according to the first embodiment.

As illustrated in FIG. 12, the insulation layers 120 are removed to form gaps GP. More specifically, when the insulation layers 120 are SiN, SiN is removed by wet etching using phosphoric acid. At this time, the insulation layers 108 are not removed by etching.

Figure 13:
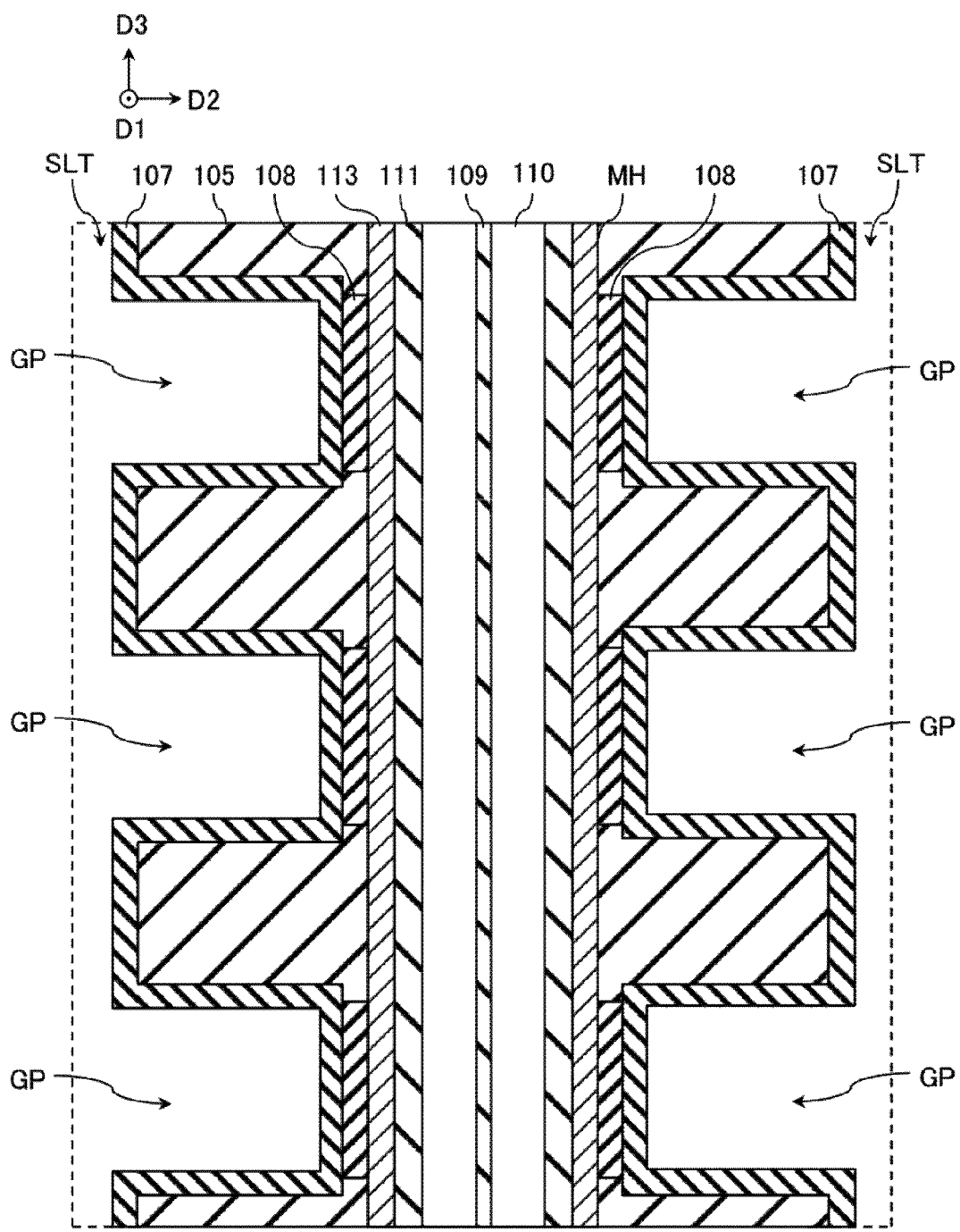
FIG. 13 is a view illustrating a process of manufacturing the memory cell array in the semiconductor storage device according to the first embodiment.

As illustrated in FIG. 13, the insulation layer 107 is formed so as to cover the slits SLT and the gaps GP. For example, the insulation layer 107 is formed by CVD having excellent step coverage, such as atomic layer deposition (ALD).

Figure 14:
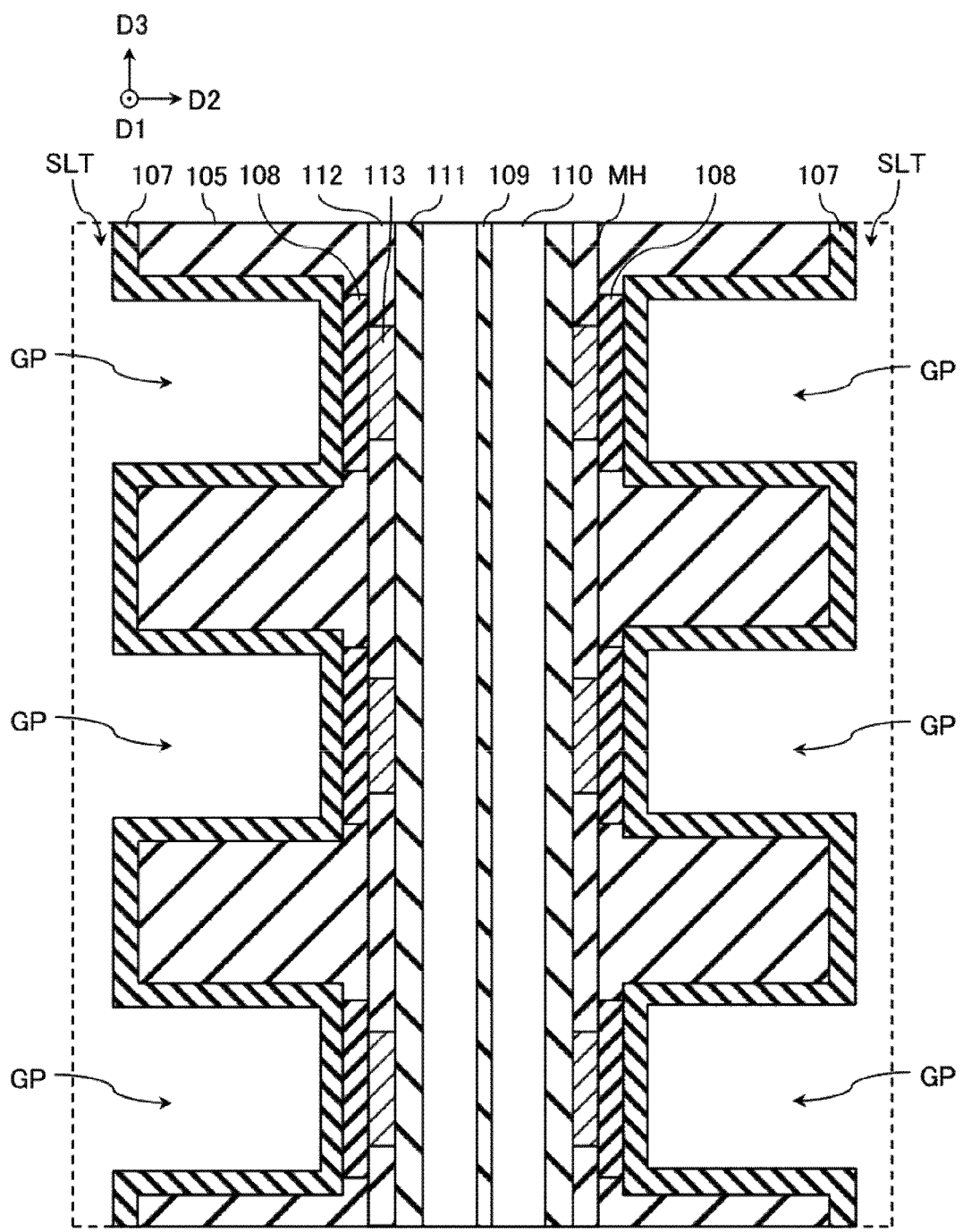
FIG. 14 is a view illustrating a process of manufacturing the memory cell array in the semiconductor storage device according to the first embodiment.

As illustrated in FIG. 14, the insulation layer 107 (SiO2) is reoxidized by radical oxidation to improve the film quality of the insulation layer 107, and a portion of the charge storage layer 113 is oxidized to form the insulation layer 112. More specifically, oxygen radicals penetrate the insulation layers 107 and 105 to oxidize the charge storage layer 113, so that the charge storage layer 113 in the area between the gaps GP (the wiring layers 106) is oxidized to form the insulation layer 112 (SiO2). At this time, since the insulation layer 108 (SiON) hardly transmits oxygen radicals, the charge storage layer 113 in the area covered by the insulation layer 108 is hardly oxidized. However, the charge storage layer 113 in the vicinity of the end portion of the insulation layer 108 is oxidized by, for example, infiltration of oxygen radicals or diffusion of oxygen from the oxidation area (the insulation layer 112) in the charge storage layer 113. Therefore, the length of the charge storage layer 113 in the third direction D3 is less than that of the insulation layer 108. The length of the charge storage layer 113 in the third direction D3 is controlled by, for example, the processing temperature and the processing time of radical oxidation.

Figure 15:
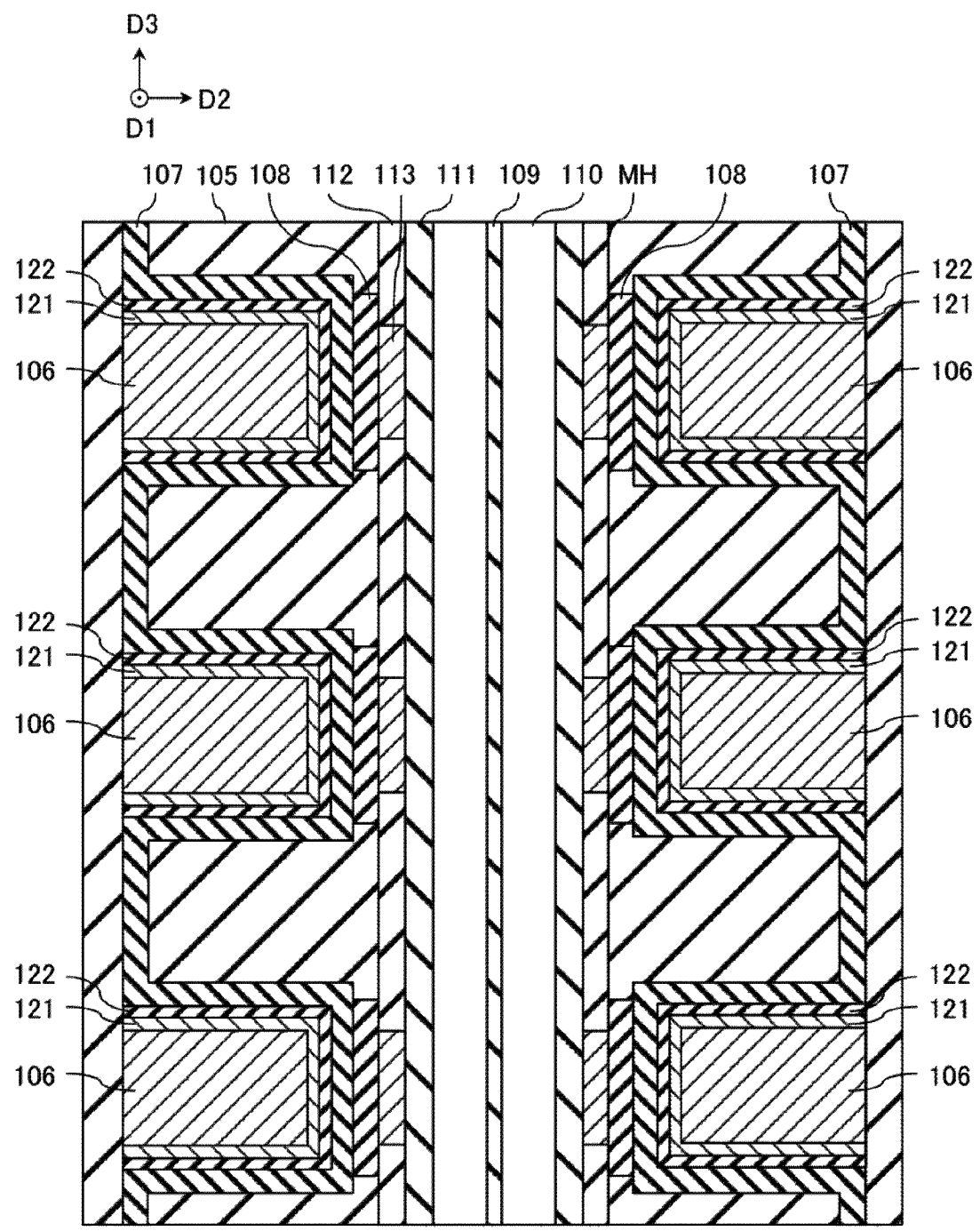
FIG. 15 is a view illustrating a process of manufacturing the memory cell array in the semiconductor storage device according to the first embodiment.

As illustrated in FIG. 15, the wiring layers 106 are formed, and the slit SLT is backfilled with the interlayer insulation film 105. More specifically, AlOx used for the second barrier layer 122 and TiN used for the first barrier layer 121 are sequentially formed. Subsequently, W used for the wiring layer 106 is formed so as to fill the inside of the gap GP. Subsequently, a surplus of a W/TiN/AlOx stacked film on the side surface and the bottom surface of the slit SLT and on the interlayer insulation film 105 is removed to form the wiring layer 106. Thereafter, the slit SLT is filled with the interlayer insulation film 105. In addition, while an example of FIG. 15 illustrates a case where the insulation layer 107 in contact with the side surface of the trench TR remains, when etching the W/TiN/AlOx stacked film, the insulation layer 107 in contact with the side surface of the trench TR may be removed and separated, similar to the first barrier layer 121 and the second barrier layer 122.

In the above embodiment, the insulation layer 112 is formed by oxidizing the charge storage layer 113 using the insulation layer 108 (SiON) as a mask (FIG. 14). Therefore, the insulation layer 112 is a self-aligned layer. In addition, the wiring layer 106 is formed so as to fill the inside of the gap GP. Therefore, the wiring layer 106 is self-aligned with the pattern of the charge storage layer 113 (FIG. 15).

1.3 Effect of Present Embodiment

With a configuration according to the present embodiment, the chip area of the semiconductor storage device may be reduced. This effect will be described in detail.

With a configuration according to the present embodiment, it is possible to form a plurality of separated charge storage layers 113 between the memory cell transistors MT in the memory pillar MP. More specifically, the charge storage layer 113 between the wiring layers 106 may be oxidized by radical oxidation to form the insulation layers 112, so that the charge storage layers 113 may be separated for each memory cell transistor MT. Therefore, the pitch between the adjacent memory cell transistors MT may be reduced, as compared with a case where the charge storage layers 113 are formed outside the memory pillar MP. Therefore, an increase in the chip area due to high integration may be prevented, and the chip area may be reduced.

2. Second Embodiment

Next, a second embodiment will be described. In the second embodiment, the shape of the charge storage layer 113, which is different from that in the first embodiment, will be described. Only differences from the first embodiment will be described below.

2.1 Cross-Sectional Configuration of Memory Cell Transistor

Figure 16:
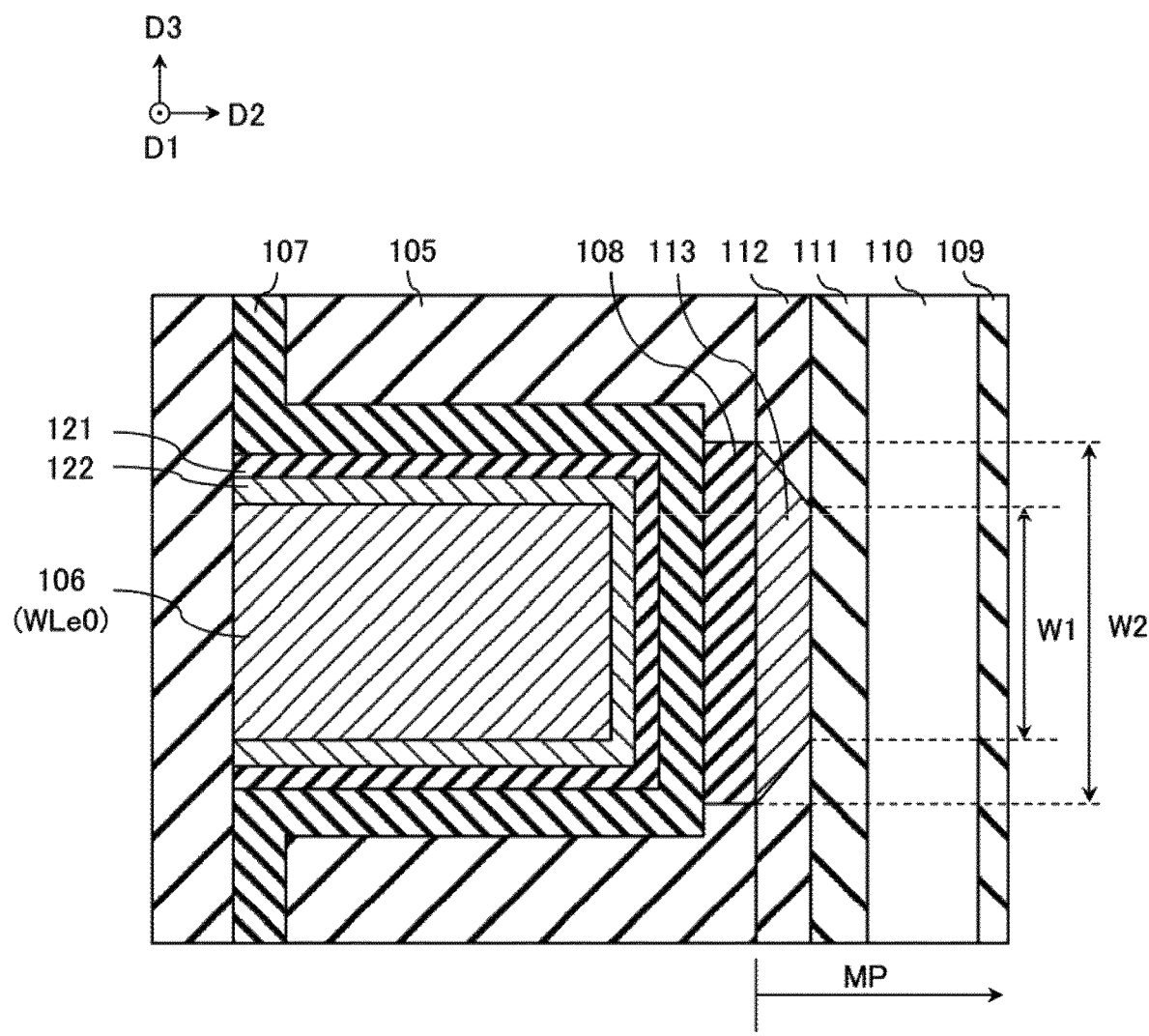
FIG. 16 is a cross-sectional view of area RA in a memory cell array in a semiconductor storage device according to a second embodiment.

Across-sectional configuration of the memory cell transistor MT will be described in detail with reference to FIG. 16. FIG. 16 illustrates a cross-sectional view of the wiring layer 106, which functions as the word line WLe0, and a portion of the memory pillar MP taken along the third direction D3, similar to FIG. 7 of the first embodiment.

As illustrated in FIG. 16, the length W2 of the surface of the charge storage layer 113, which is in contact with the insulation layer 108, in the third direction D3 is longer than the length W1 of the surface of the charge storage layer 113, which is in contact with the insulation layer 111, in the third direction D3. Such a configuration may be adopted.

2.2 Effect of Present Embodiment

With a configuration according to the present embodiment, the same effect as that of the first embodiment may be obtained.

3. Third Embodiment

Next, a third embodiment will be described. In the third embodiment, a method of manufacturing the memory cell array 2, which is different from that of the first embodiment, will be described. Only differences from the first embodiment will be described below.

3.1 Method of Manufacturing Memory Cell Array

A method of manufacturing the memory cell array 2 will be described with reference to FIGS. 17 to 19. Similar to FIGS. 8 to 15 of the first embodiment, FIGS. 17 to 19 illustrate cross-sectional views of the wiring layers 106, which function as the word lines WLe0 to WLe2 and WLo0 to WLo2, and a portion of the memory pillar MP, are arranged along the third direction D3.

Until the memory pillar MP is formed, the method is the same as FIGS. 8 to 10 of the first embodiment.

Figure 17:
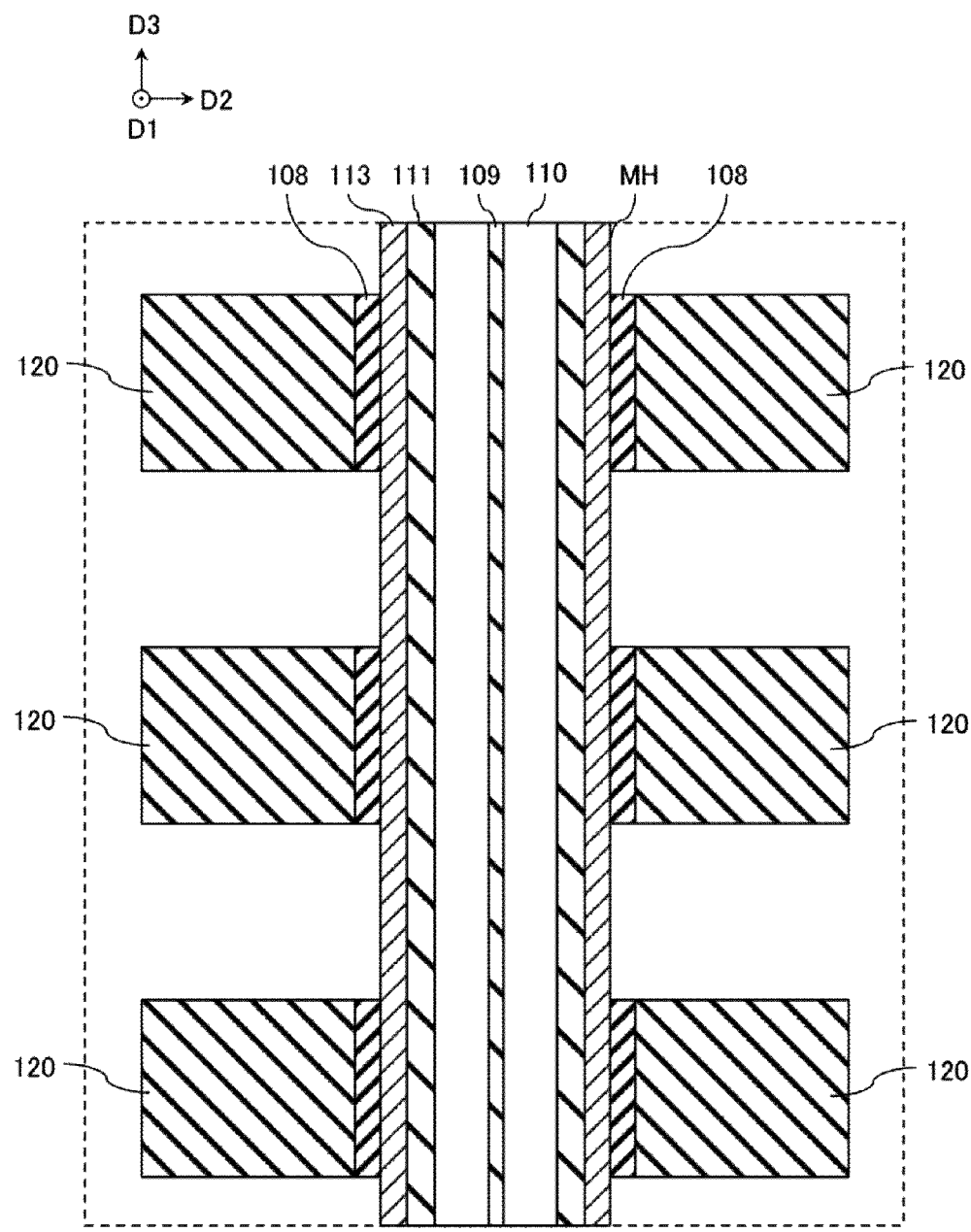
FIG. 17 is a view illustrating a process of manufacturing a memory cell array in a semiconductor storage device according to a third embodiment.

As illustrated in FIG. 17, the interlayer insulation film 105 is removed. More specifically, for example, SiO2 used for the interlayer insulation film 105 is removed by wet etching using a hydrofluoric-acid-based chemical liquid. At this time, the insulation layers 108 and 120 are not removed by wet etching.

Figure 18:
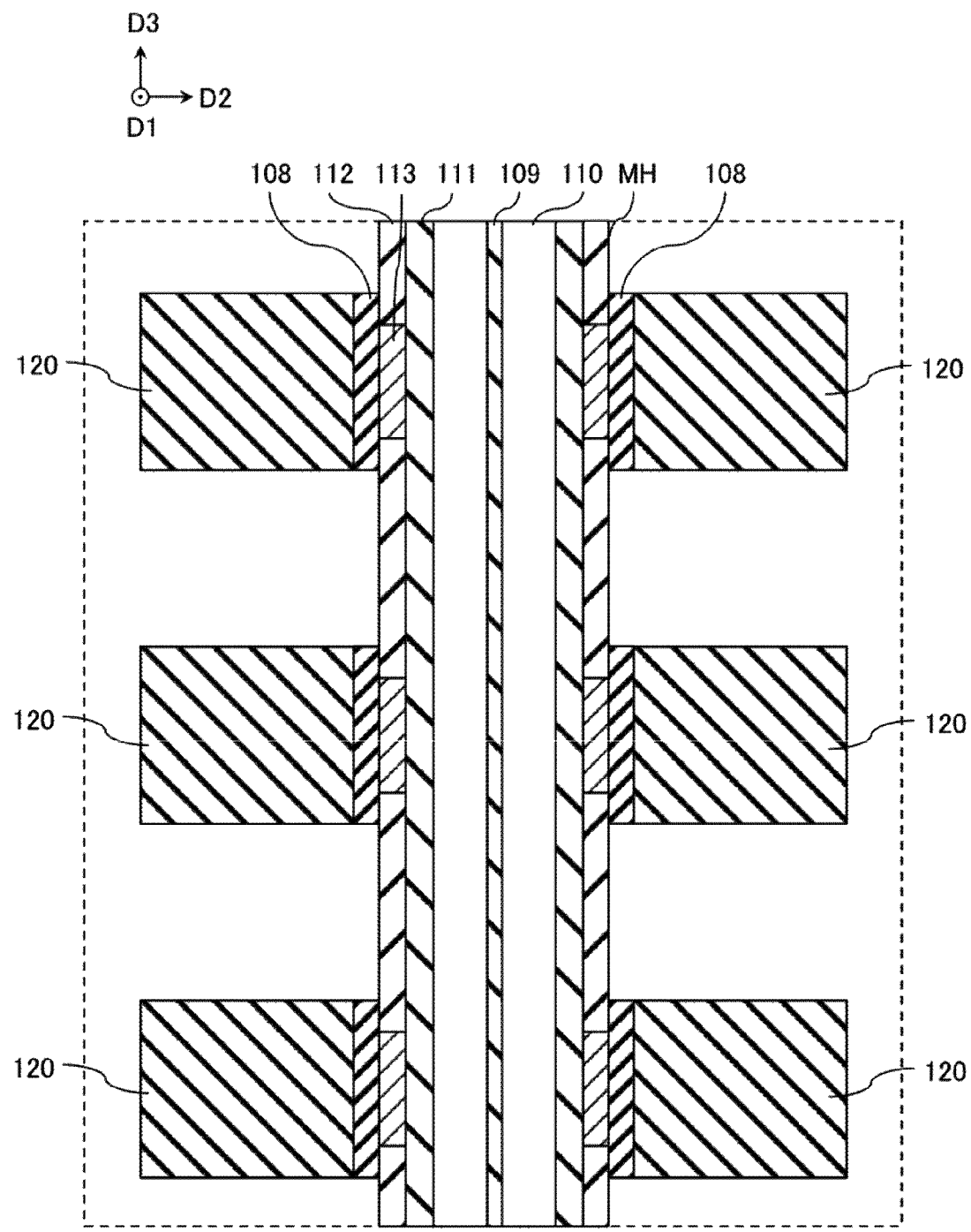
FIG. 18 is a view illustrating a process of manufacturing the memory cell array in the semiconductor storage device according to the third embodiment.
Figure 19:
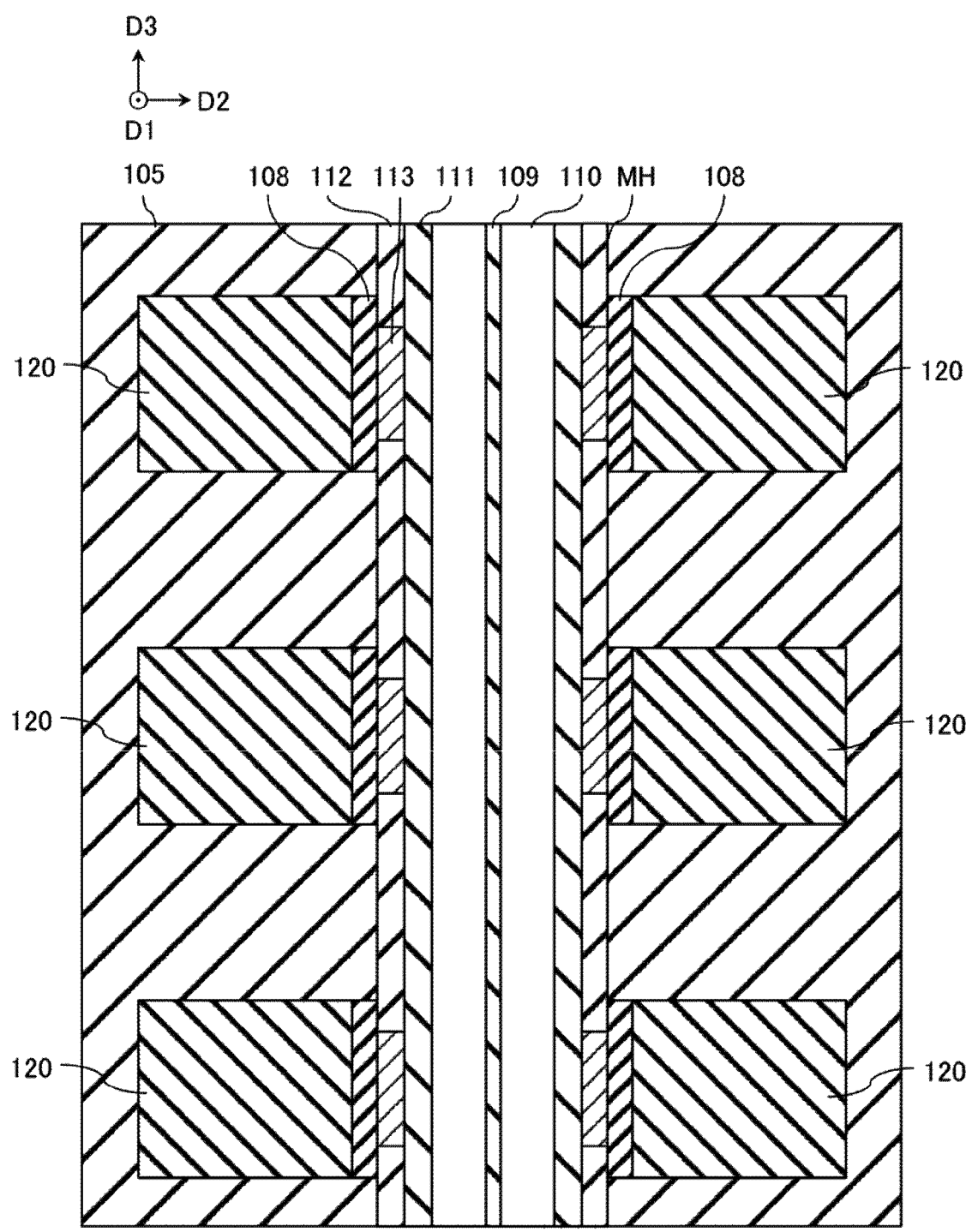
FIG. 19 is a view illustrating a process of manufacturing the memory cell array in the semiconductor storage device according to the third embodiment.

As illustrated in FIG. 18, the exposed charge storage layer 113 between the insulation layers 120 is oxidized to form the insulation layer 112. The oxidation method may be radical oxidation, may be rapid thermal annealing (RTA), or may be oxidation using oxygen plasma, without being limited thereto. At this time, since the charge storage layer 113 in the vicinity of the end portion of the insulation layer 108 is oxidized, the length of the charge storage layer 113 in the third direction D3 is less than that of the insulation layer 108.

As illustrated in FIG. 19, backfilling by the interlayer insulation film 105 is performed. More specifically, the interlayer insulation film 105 is formed so as to fill the memory pillar MP and the insulation layers 120.

The following processes are the same as those described in FIGS. 12, 13, and 15 of the first embodiment. Similarly, in the present embodiment, since the insulation layer 112 has already been formed, the radical oxidation after formation of the insulation layer 107 may be omitted.

3.2 Effect of Present Embodiment

With a configuration according to the present embodiment, the same effect as that of the first embodiment may be obtained.

4. Fourth Embodiment

Next, a fourth embodiment will be described. In the fourth embodiment, a method of manufacturing a memory cell array, which is different from those of the first and third embodiments, will be described. Only differences from the first and third embodiments will be described below.

4.1 Method of Manufacturing Memory Cell Array

Figure 20:
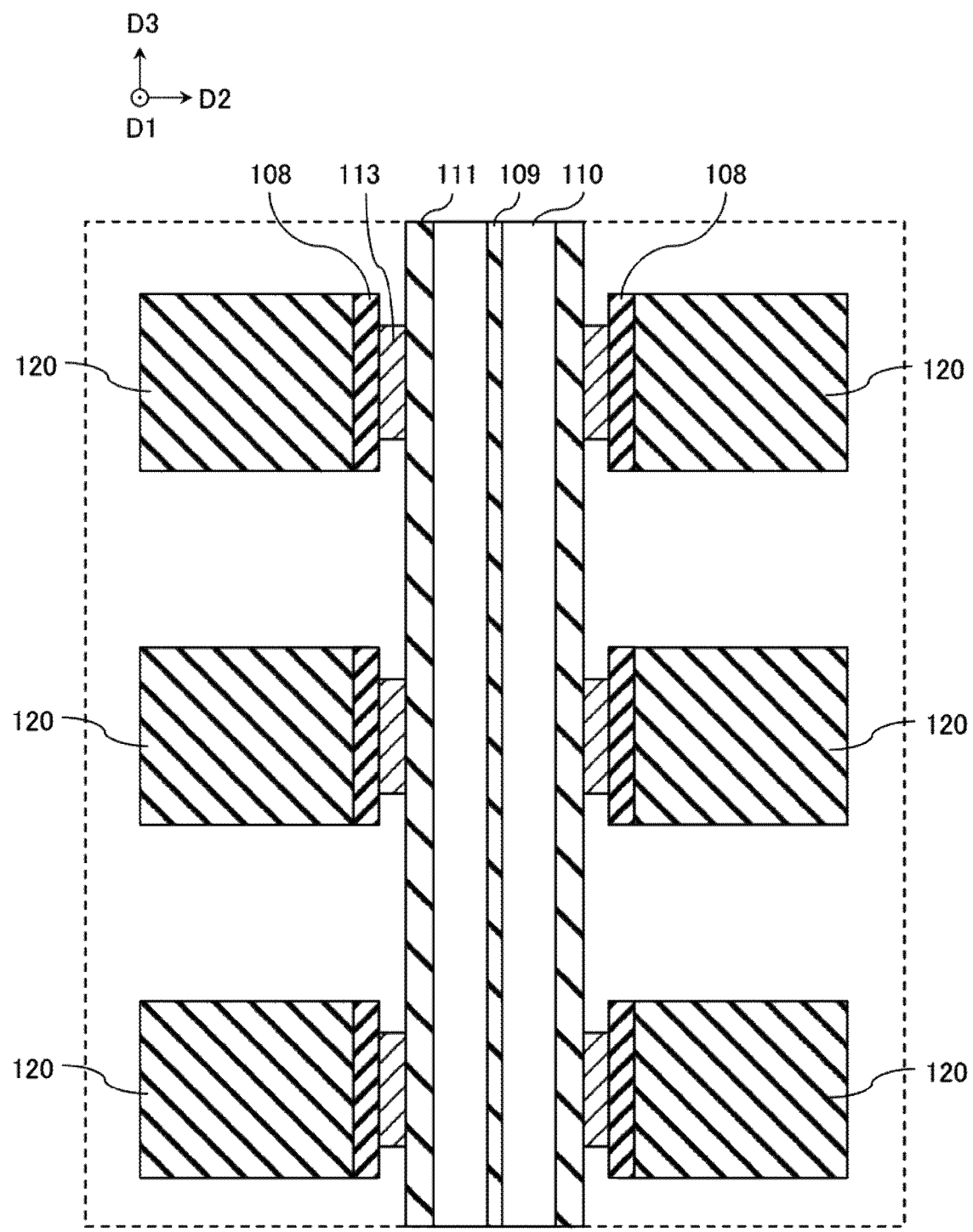
FIG. 20 is a view illustrating a process of manufacturing a memory cell array in a semiconductor storage device according to a fourth embodiment.
Figure 21:
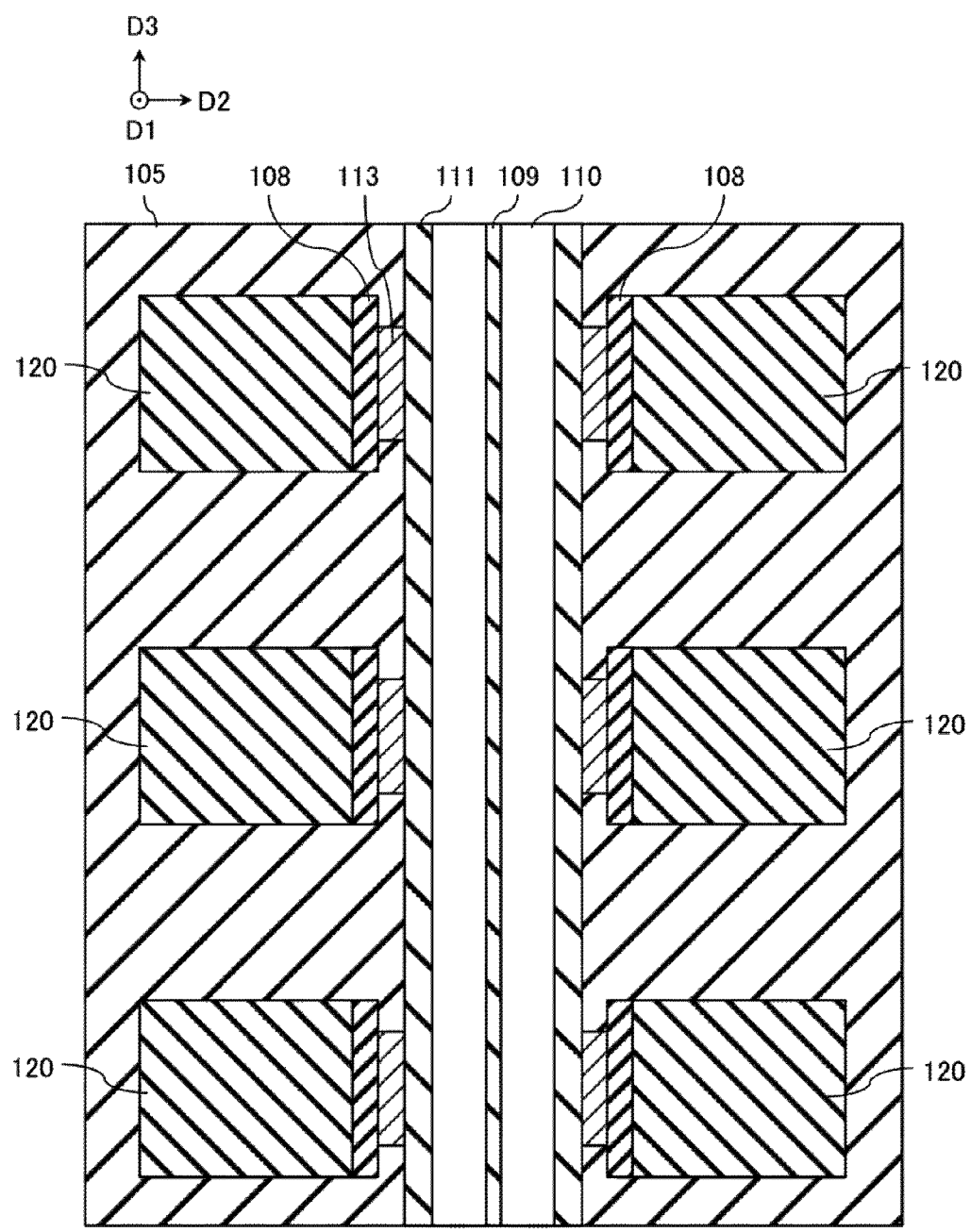
FIG. 21 is a view illustrating a process of manufacturing the memory cell array in the semiconductor storage device according to the fourth embodiment.
Figure 22:
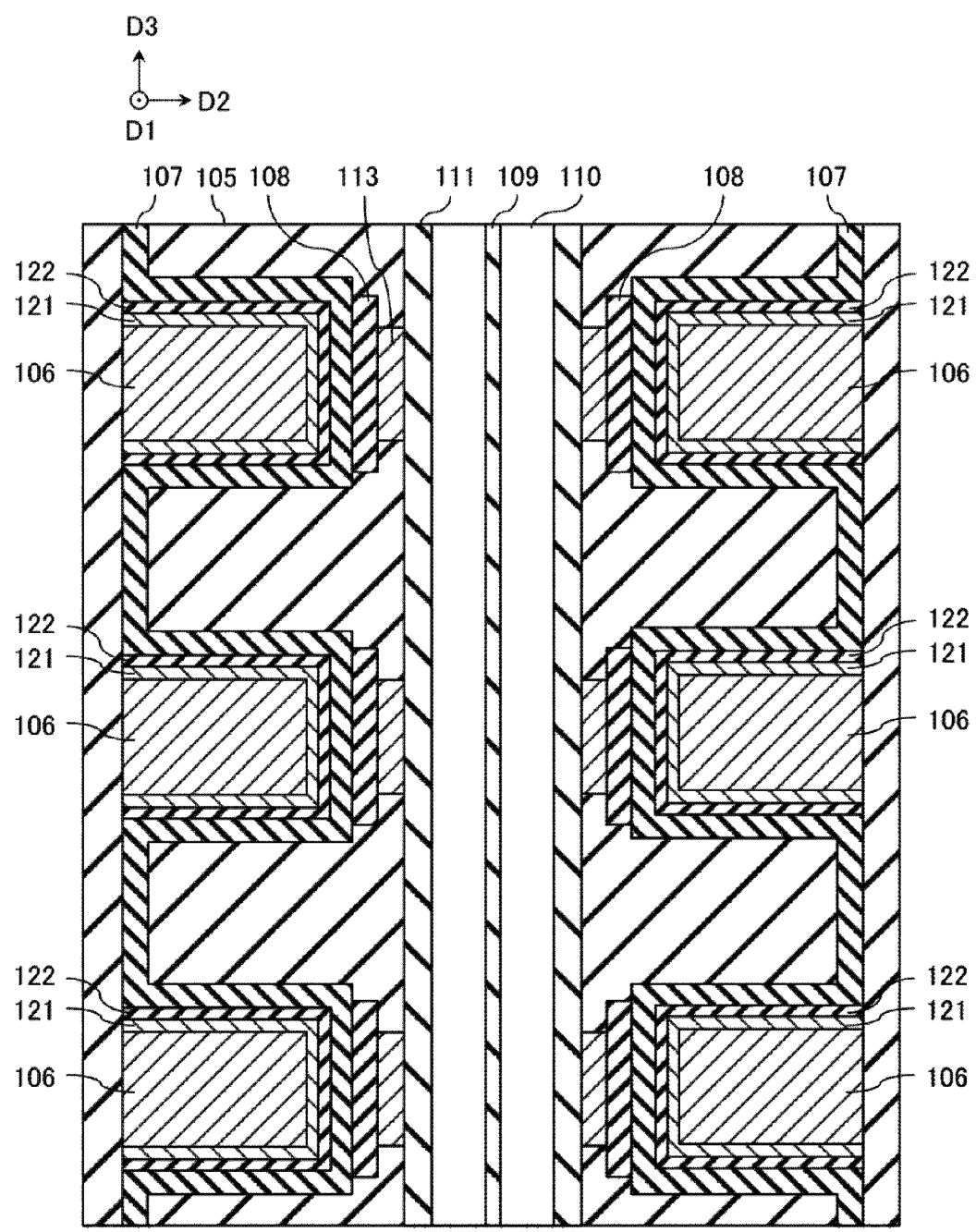
FIG. 22 is a view illustrating a process of manufacturing the memory cell array in the semiconductor storage device according to the fourth embodiment.

A method of manufacturing the memory cell array 2 will be described with reference to FIGS. 20 to 22. FIGS. 20 to 22 illustrate cross-sectional views of the wiring layers 106, which function as the word lines WLe0 to WLe2 and WLo0 to WLo2, and a portion of the memory pillar MP taken along the third direction D3, similar to FIGS. 8 to 15 of the first embodiment.

Until the interlayer insulation film 105 is removed, the method is the same as FIG. 17 of the third embodiment.

As illustrated in FIG. 20, the exposed charge storage layer 113 between the insulation layers 120 is removed by etching. The etching method may be dry etching, may be wet etching, or may be appropriately selected depending on the material of the charge storage layer 113. For example, when TaN or TiN is used for the charge storage layer 113, wet etching using an acid-based chemical liquid may be used. At this time, since the charge storage layer 113 in the vicinity of the end portion of the insulation layer 108 is also etched, the length of the charge storage layer 113 in the third direction D3 is less than that of the insulation layer 108. The length of the charge storage layer 113 in the third direction D3 is controlled based on etching conditions.

As illustrated in FIG. 21, as in a case of FIG. 19 of the third embodiment, backfilling by the interlayer insulation film 105 is performed.

As illustrated in FIG. 22, the wiring layers 106 are formed in the same manner as in the description of FIGS. 12, 13, and 15 of the first embodiment. In the present embodiment, as in the third embodiment, the radical oxidation after formation of the insulation layer 107 may be omitted.

4.2 Effect of Present Embodiment

With a configuration according to the present embodiment, the same effect as that of the first embodiment may be obtained.

In addition, in a configuration according to the present embodiment, the charge storage layer 113 may be separated by etching the charge storage layer 113 between the wiring layers 106.

5. Fifth Embodiment

Next, a fifth embodiment will be described. In the fifth embodiment, a configuration of the memory cell array 2, which is different from the first embodiment, will be described. Only differences from the first embodiment will be described below.

5.1 Configuration of Memory Cell Array

Figure 23:
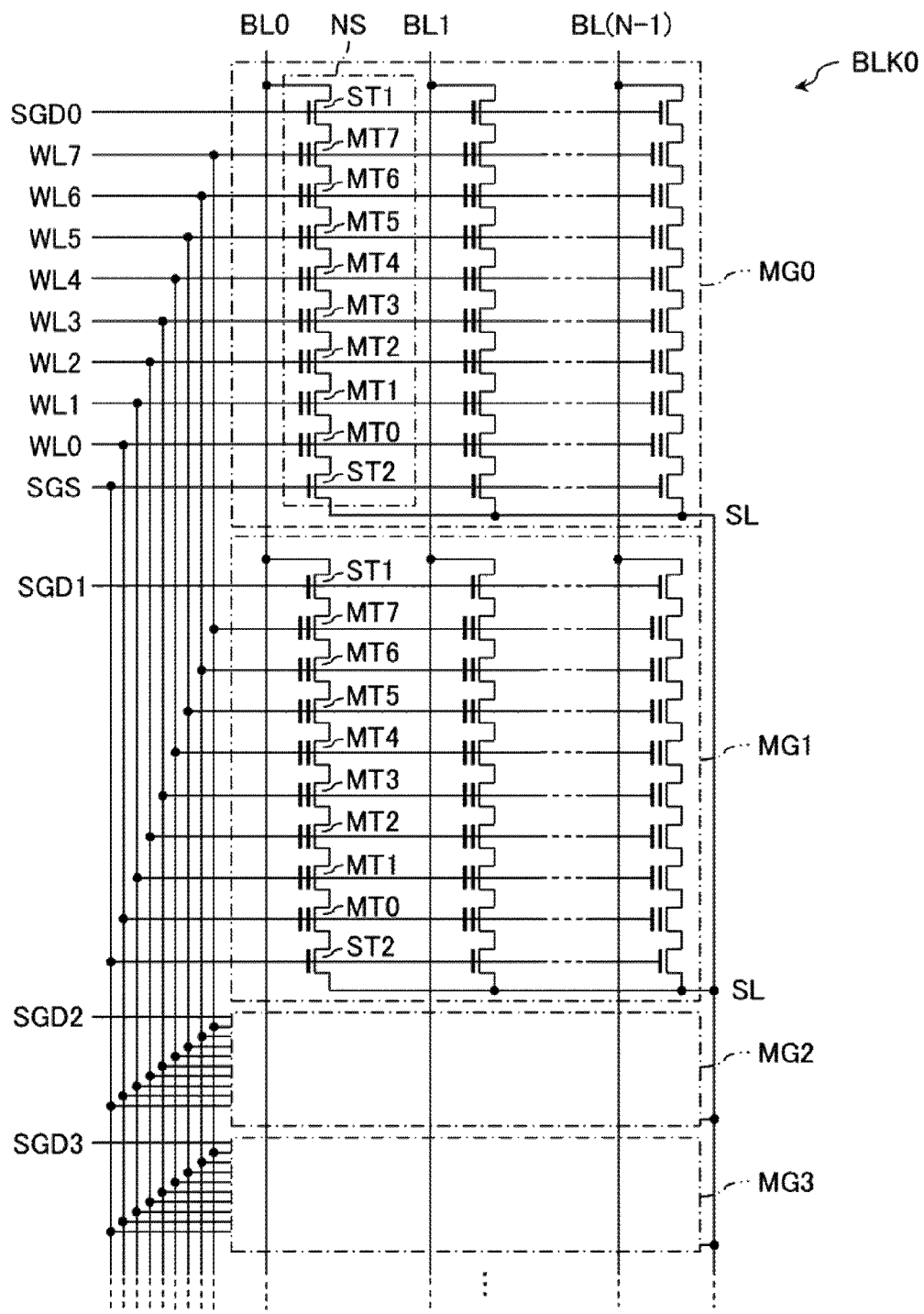
FIG. 23 is a circuit diagram of a memory cell array in a semiconductor storage device according to a fifth embodiment.

A configuration of the memory cell array 2 will be described with reference to FIG. 23. FIG. 23 illustrates a circuit diagram of a memory cell array in one block BLK.

As illustrated in FIG. 23, a configuration of each memory group MG is the same as that of the first embodiment. In the present embodiment, the gates of the select transistors ST 2 included in each of the memory groups MG0 to MG3 are connected in common to the select gate line SGS, for example. In addition, control gates of the memory cell transistors MT0 to MT7 in each of the memory groups MG0 to MG3 are connected in common to the word lines WL0 to WL7, respectively.

5.2 Planar Configuration of Memory Cell Array

Figure 24:
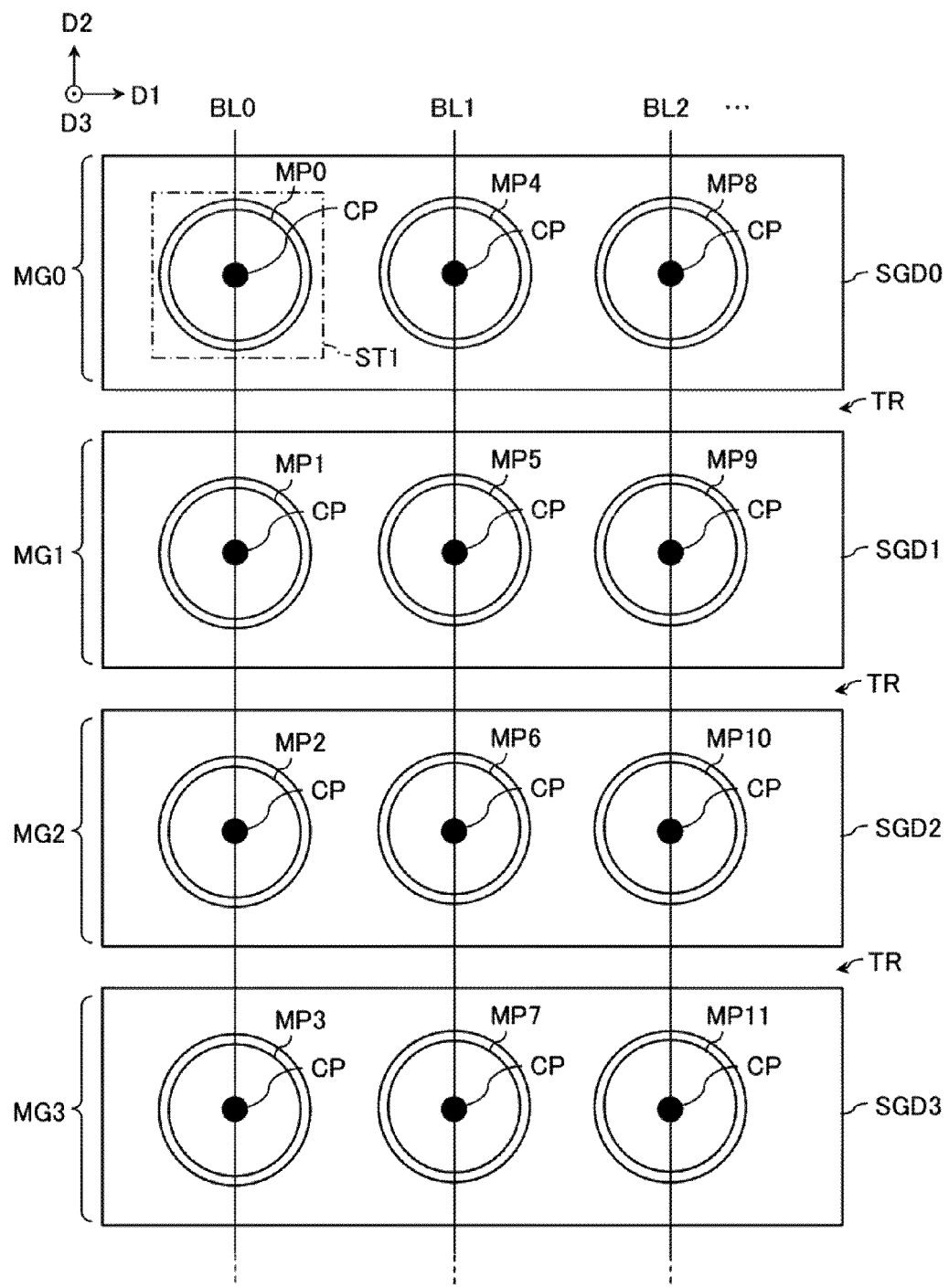
FIG. 24 is a plan view of the memory cell array in the semiconductor storage device according to the fifth embodiment.

Next, a planar configuration of the memory cell array 2 will be described with reference to FIG. 24. FIG. 24 illustrates the planar layout of the select gate line SGD. In this example, a case where four memory groups MG are provided in one block BLK. That is, a case where four select gate lines SGD are provided will be described. In addition, in an example of FIG. 24, the interlayer insulation film is omitted.

As illustrated in FIG. 24, the select gate lines SGD0 to SGD3, which extend in a first direction D1 parallel to the semiconductor substrate, are arranged along the second direction D2, which is parallel to the semiconductor substrate and is perpendicular to the first direction D1.

A plurality of memory pillars MP (MP0, MP4, MP8, . . . ) are provided along the first direction D1 so as to penetrate the select gate line SGD0, and a plurality of memory pillars MP (MP1, MP5, MP9, . . . ) are provided along the first direction D1 so as to penetrate the select gate line SGD1. In addition, a plurality of memory pillars MP (MP2, MP6, MP10, . . . ) are provided along the first direction D1 so as to penetrate the select gate line SGD2, and a plurality of memory pillars MP (MP3, MP7, MP11, . . . ) are provided along the first direction D1 so as to penetrate the select gate line SGD3.

The memory pillars MP0 to MP3 arranged along the second direction D2 are connected to the bit line BL0, which extends in the second direction D2, via the contact plugs CP, respectively. Similarly, the memory pillars MP4 to MP7 are connected to the bit line BL1, and the memory pillars MP8 to MP11 are connected to the bit line BL2. A relationship between the other memory pillars MP and the bit lines BL is also the same. In addition, similar to the first embodiment, four memory pillars MP (e.g., MP0, MP1, MP2 and MP3) arranged along the second direction may be connected in common by the wiring layer 114, and the contact plugs CP may be formed on the wiring layer 114 so as to be connected to the bit lines BL.

5.3 Planar Configuration of Memory Cell Transistor

Figure 25:
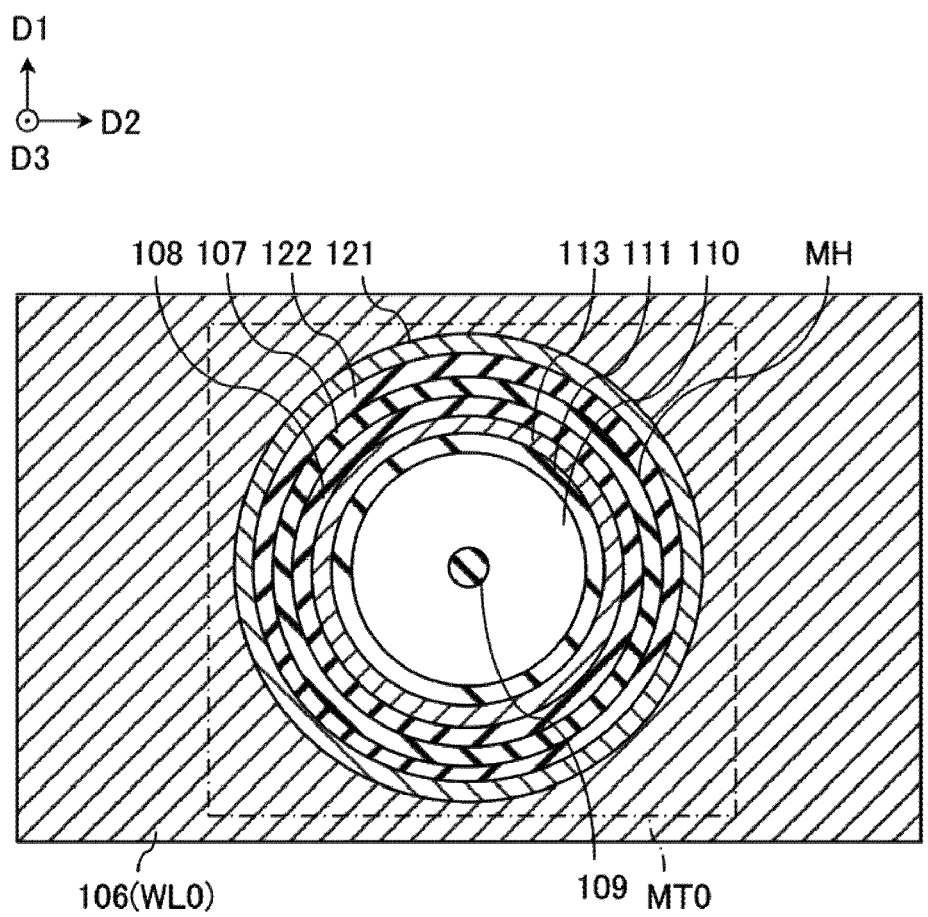
FIG. 25 is a cross-sectional view of a memory cell transistor in a plane parallel to a semiconductor substrate in the semiconductor storage device according to the fifth embodiment.

Next, a planar configuration of the memory cell transistor MT will be described in detail with reference to FIG. 25. FIG. 25 is a cross-sectional view of the wiring layer 106, which functions as the word line WL0, and the memory pillar MP taken along a plane parallel to the semiconductor substrate, similarly to FIG. 6 of the first embodiment.

As illustrated in FIG. 25, the memory pillar MP is formed so as to penetrate the wiring layer 106, which functions as the word line WL0.

In the memory pillar MP, the semiconductor layer 110 is provided so as to surround the core layer 109, and the insulation layer 111 is further provided so as to surround the semiconductor layer 110. In addition, the charge storage layer 113 is provided so as to surround the insulation layer 111.

The insulation layer 108 is provided so as to surround the memory pillar MP, that is, the charge storage layer 113, and the insulation layer 107 is further provided so as to surround the insulation layer 108. In addition, the second barrier layer 122 is provided so as to surround the insulation layer 107, and the first barrier layer 121 is further provided so as to surround the second barrier layer 122. Then, the wiring layer 106 is provided so as to be in contact with the first barrier layer 121.

An area, which includes the wiring layer 106 functioning as the word line WL0 and the memory pillar MP, functions as the memory cell transistor MT0 of the memory group MG0.

5.4 Effect of Present Embodiment

With a configuration according to the present embodiment, the same effect as that of the first embodiment may be obtained.

In addition, in a configuration according to the present embodiment, the second to fourth embodiments may be applied.

6. Sixth Embodiment

Next, a sixth embodiment will be described. In the sixth embodiment, two examples of a planar configuration of the word line WL in the memory cell array 2 will be described. Only differences from the first embodiment will be described below.

6.1 First Example

Figure 26:
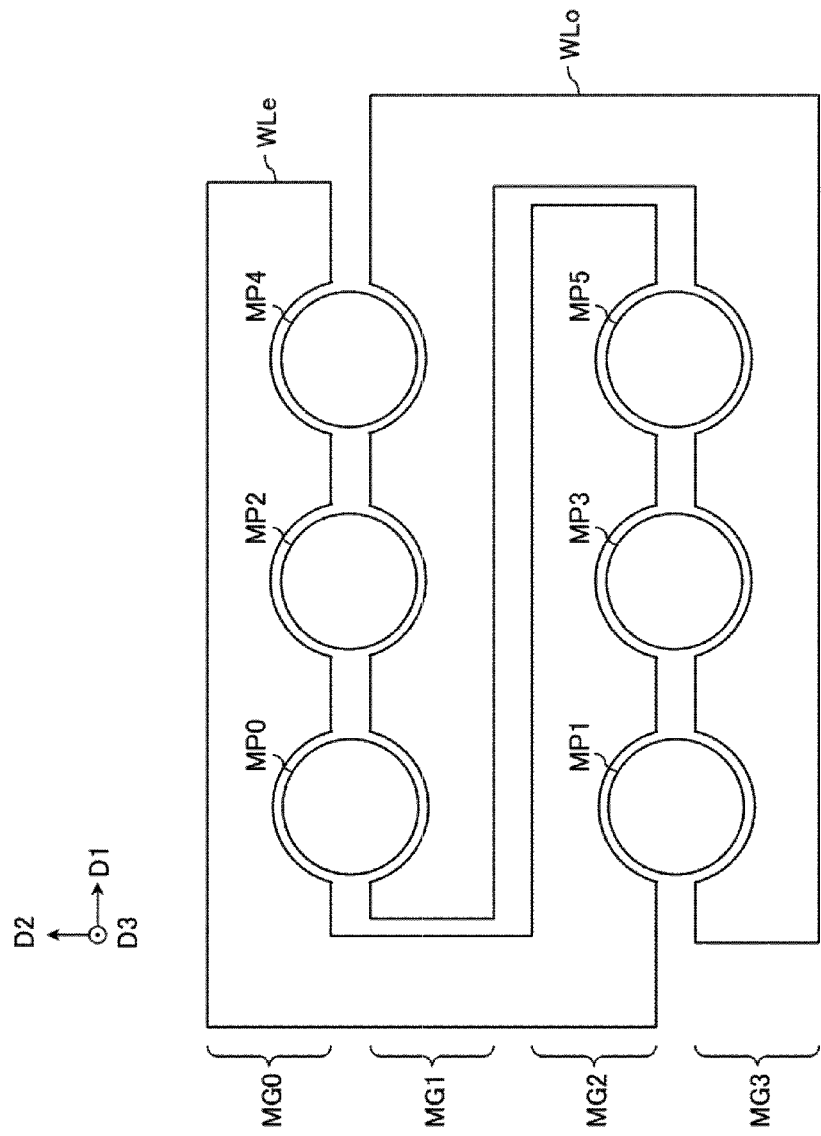
FIG. 26 is a plan view of a memory cell array in a semiconductor storage device according to a first example of a sixth embodiment.

First, a first example will be described with reference to FIG. 26. FIG. 26 illustrates the planar layout of the word line WL in a certain block BLK. In the present example, a case where four memory groups MG are provided in one block BLK will be described. In addition, in an example of FIG. 26, the interlayer insulation film is omitted.

As illustrated in FIG. 26, the memory groups MG0 to MG3 are sequentially arranged along the second direction D2, and two word lines WLe, which correspond respectively to the memory groups MG0 and MG2, and two word lines WLo, which correspond respectively to the memory groups MG1 and MG3, extend in the first direction D1. Then, end portions of the two word lines WLe, which correspond respectively to the memory groups MG0 and MG2, are connected to each other. Similarly, end portions of the two word lines WLo, which correspond respectively to the memory groups MG1 and MG3, are connected to each other.

More specifically, in an example of FIG. 26, the first wiring layer 106 and the third wiring layer 106 are connected to each other, and the second wiring layer 106 and the fourth wiring layer 106 are connected to each other along the second direction D2. Then, a plurality of memory pillars MP are arranged along the first direction D1 between the first wiring layer 106 and the second wiring layer 106 and between the third wiring layer 106 and the fourth wiring layer 106, and no memory pillar MP is disposed between the second wiring layer 106 and the third wiring layer 106.

6.2 Second Example

Figure 27:
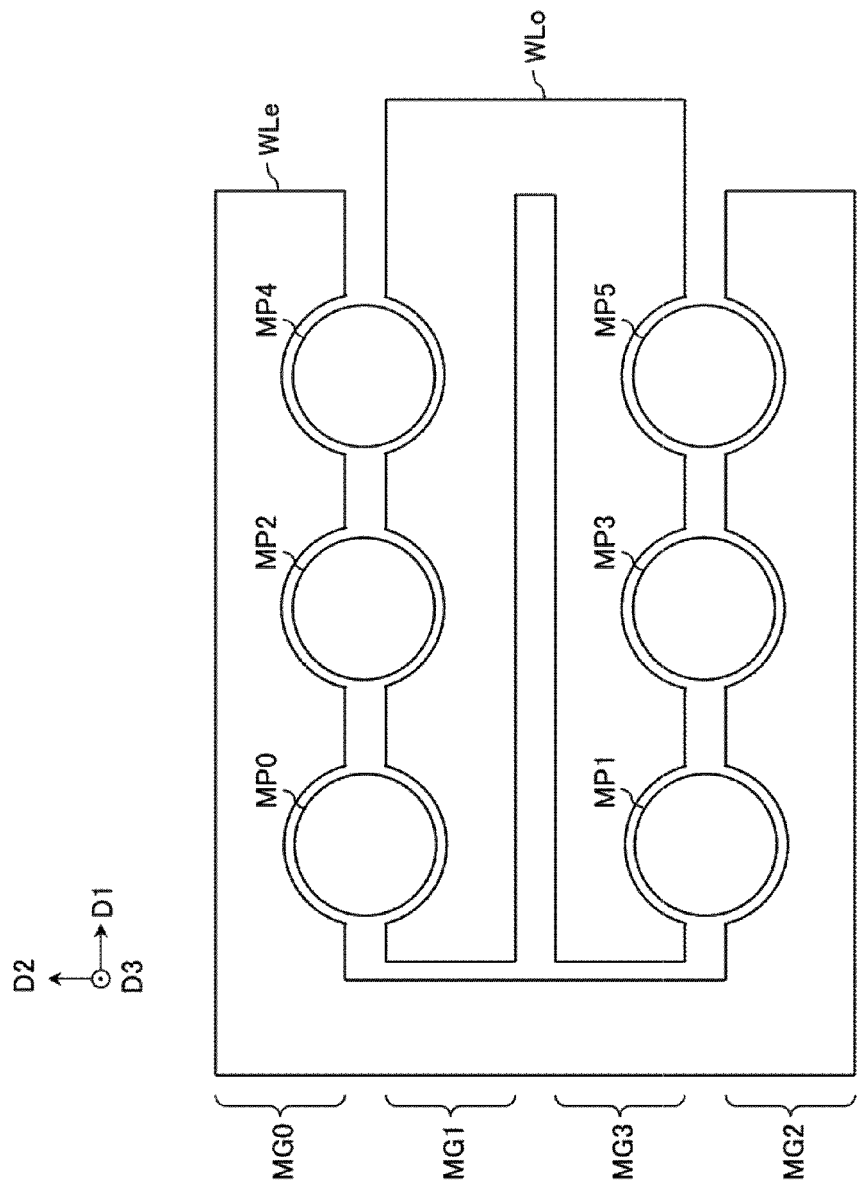
FIG. 27 is a plan view of a memory cell array in a semiconductor storage device according to a second example of the sixth embodiment.

Next, a second example will be described with reference to FIG. 27. FIG. 27 illustrates the planar layout of the word line WL in a certain block BLK. In the present example, a case where four memory groups MG are provided in one block BLK will be described. In addition, in the example of FIG. 27, the interlayer insulation film is omitted. Only different points from the first example will be described below.

As illustrated in FIG. 27, in this example, the memory groups MG0, MG1, MG3 and MG2 are sequentially arranged along the second direction D2. Therefore, in the example of FIG. 27, the first wiring layer 106 and the fourth wiring layer 106 are connected to each other, and the second wiring layer 106 and the third wiring layer 106 are connected to each other along the second direction D2. Then, a plurality of memory pillars MP extend along the first direction D1 between the first wiring layer 106 and the second wiring layer 106 and between the third wiring layer 106 and the fourth wiring layer 106, and no memory pillar MP is disposed between the second wiring layer 106 and the third wiring layer 106.

6.3 Effect of Present Embodiment

A configuration according to the present embodiment may be applied to the first to fourth embodiments.

7. Modification

The semiconductor storage device according to the above-described embodiment includes a semiconductor substrate; a plurality of first wiring layers 106 stacked above the semiconductor substrate in the first direction, which is perpendicular to the semiconductor substrate, and extending in the second direction, which intersects the first direction and is parallel to the semiconductor substrate; a first memory pillar including the semiconductor layer 110 extending in the first direction, the first insulation layer 111 extending in the first direction and provided between the plurality of first wiring layers and the semiconductor layer so as to be in contact with the semiconductor layer, and a plurality of charge storage layers 113 respectively provided between the plurality of first wiring layers and the first insulation layer such that each of the plurality of charge storage layers is in contact with the first insulation layer respectively; and a plurality of second insulation layers 108 provided between each of the plurality of first wiring layers and each of the plurality of charge storage layers.

By applying the above embodiment, it is possible to provide a semiconductor storage device capable of reducing the chip area.

In addition, it should be noted that the embodiments are not limited to the above-described embodiments, and various modifications are possible.

For example, in the above embodiment, the memory pillar MP may not be in contact with the semiconductor substrate 100. For example, another circuit such as, for example, the sense amplifier 4 may be provided between the semiconductor substrate 100 and the memory cell array 2 in the third direction D3. In this case, a wiring layer, which functions as the source line SL, may be provided above another circuit, and the memory pillar MP may be provided on the wiring layer.

In addition, the term "connection" in the above embodiment also includes a state where two are indirectly connected to each other with, for example, a transistor or a resistor interposed therebetween.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying

What is claimed is:

1. A semiconductor storage device comprising:
   a semiconductor substrate;
   a plurality of first wiring layers stacked above the semiconductor substrate in a first direction, which is perpendicular to the semiconductor substrate, and extending in a second direction, which intersects the first direction and is parallel to the semiconductor substrate;
   a plurality of second wiring layers stacked above the semiconductor substrate in the first direction, the plurality of first wiring layers and the plurality of second wiring layers arranged in a third direction crossing the first direction and the second direction, and extending in the second direction;
   a first memory pillar including a semiconductor layer provided between the plurality of first wiring layers and the plurality of second wiring layers, extending in the first direction, a first insulation layer extending in the first direction and provided between the plurality of first wiring layers and the semiconductor layer so as to contact the semiconductor layer, and a plurality of charge storage layers respectively provided between the plurality of first wiring layers and the first insulation layer, such that one or more of the plurality of charge storage layers contacts the first insulation layer; and
   a plurality of second insulation layers respectively provided between each of the plurality of first wiring layers and each of the plurality of charge storage layers.

2. The semiconductor storage device according to claim 1, wherein a length of each of the plurality of second insulation layers in the first direction is longer than a length of each of the plurality of charge storage layers.

3. The semiconductor storage device according to claim 2, wherein a thickness of each of the plurality of charge storage layers in an axial direction of the first memory pillar is 2 nm or more and 4 nm or less.

4. The semiconductor storage device according to claim 1, wherein each of the plurality of charge storage layers is configured such that in the first direction, a length of a surface thereof which is in contact with one of the plurality of second insulation layers is longer than a length of a surface thereof in the first direction which is in contact with the first insulation layer.

5. The semiconductor storage device according to claim 1, wherein a thickness of each of the plurality of charge storage layers in an axial direction of the first memory pillar is 2 nm or more and 4 nm or less.

6. The semiconductor storage device according to claim 4, wherein the plurality of first wiring layers comprises at least two wiring layers sequentially arranged along the second direction.

7. The semiconductor storage device according to claim 1, wherein the first memory pillar is electrically connected to a third wiring layer, which is provided above the first memory pillar.

8. The semiconductor storage device according to claim 7, further comprising:
   a plurality of third insulation layers provided between each of the plurality of second wiring layers and the first memory pillar,
   wherein the first memory pillar further includes a plurality of charge storage layers provided on a side surface of the first memory pillar so as to contact the plurality of third insulation layers, respectively.

9. The semiconductor storage device according to claim 8, further comprising:
   a plurality of fourth wiring layers extending in the second direction and arranged adjacent to the plurality of second wiring layers in the third direction;
   a plurality of fifth wiring layers extending in the second direction and arranged adjacent to the plurality of fourth wiring layers in the third direction; and
   a second memory pillar provided between the plurality of fourth wiring layers and the plurality of fifth wiring layers and extending in the first direction,
   wherein the plurality of second wiring layers and the plurality of fourth wiring layers are provided between the first memory pillar and the second memory pillar.

10. The semiconductor storage device according to claim 9, wherein the plurality of first wiring layers is electrically connected to one of the plurality of fourth wiring layers or the plurality of fifth wiring layers, and the plurality of second wiring layers is electrically connected to a remaining one of the plurality of fourth wiring layers or the plurality of fifth wiring layers.

11. The semiconductor storage device according to claim 1, further comprising:
   a second memory pillar extending in the first direction and provided between the plurality of first wiring layers and the plurality of second wiring layers, the first memory pillar and the second memory pillar being arranged in the second direction; and
   third insulation layers provided between the plurality of first wiring layers and the plurality of second wiring layers.

12. The semiconductor storage device according to claim 1, wherein the third insulation layers are provided between the first memory pillar and the second memory pillar.

13. The semiconductor storage device according to claim 1, wherein the first memory pillar include fourth insulation layers, the fourth insulation layers provided between the plurality of charge storage layers respectively in the first direction.

14. The semiconductor storage device according to claim 13, further comprising:
   fifth insulation layers including a first face and being provided between the plurality of first wiring layers respectively in the first direction, the first face being contact with the fourth insulation layers.

15. The semiconductor storage device according to claim 14, wherein the plurality of second insulation layers include a second face, the second face contact with each of the plurality of charge storage layers respectively and the fourth insulation layers.

* * * * *